(12) United States Patent
Dedic et al.

(10) Patent No.: US 9,444,479 B2
(45) Date of Patent: *Sep. 13, 2016

(54) ANALOGUE-TO-DIGITAL CONVERSION CIRCUITRY

(71) Applicant: SOCIONEXT INC., Yokohama-shi, Kanagawa (JP)

(72) Inventors: Ian Juso Dedic, Northolt Middlesex (GB); Gavin Lambertus Allen, Maidenhead (GB)

(73) Assignee: SOCIONEXT INC., Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/553,598

(22) Filed: Nov. 25, 2014

(65) Prior Publication Data

US 2015/0077278 A1    Mar. 19, 2015

Related U.S. Application Data

(62) Division of application No. 13/712,740, filed on Dec. 12, 2012, now Pat. No. 8,928,358, which is a division of application No. 12/686,757, filed on Jan. 13, 2010, now Pat. No. 8,643,428.

(30) Foreign Application Priority Data

Jan. 26, 2009 (EP) .................................. 09250202

(51) Int. Cl.
*H03M 1/12* (2006.01)
*H03M 1/06* (2006.01)
(Continued)

(52) U.S. Cl.
CPC ............ *H03M 1/0614* (2013.01); *G11C 27/02* (2013.01); *H01H 9/54* (2013.01); *H03K 17/00* (2013.01); *H03L 7/00* (2013.01); *H03L 7/091* (2013.01); *H03M 1/002* (2013.01); *H03M 1/0881* (2013.01); *H03M 1/1009* (2013.01); *H03M 1/12* (2013.01); *H03M 1/121* (2013.01);
(Continued)

(58) Field of Classification Search
CPC .................................................. H03M 1/1019
USPC .................................. 341/155, 118, 120, 122
See application file for complete search history.

(56) References Cited

U.S. PATENT DOCUMENTS 3,761,826 A    9/1973  Lowe
5,121,121 A    6/1992  Grudkowski et al.

(Continued)

FOREIGN PATENT DOCUMENTS

CN    101294983 A    10/2008
EP    0 540 160 A2    5/1993

(Continued)

OTHER PUBLICATIONS

Chinese Office Action for Chinese Application No. 201210469760.8 dated Apr. 28, 2015.

(Continued)

*Primary Examiner* — Peguy Jean Pierre
(74) *Attorney, Agent, or Firm* — Arent Fox LLP

(57) ABSTRACT

There is disclosed current-mode time-interleaved sampling circuitry configured to be driven by substantially sinusoidal clock signals. Such circuitry may be incorporated in ADC circuitry, for example as integrated circuitry on an IC chip. The disclosed circuitry is capable of calibrating itself without being taken off-line.

8 Claims, 28 Drawing Sheets

(51) Int. Cl.

| | | |
|---|---|---|
| G11C 27/02 | (2006.01) | |
| H01H 9/54 | (2006.01) | |
| H03K 17/00 | (2006.01) | |
| H03M 1/10 | (2006.01) | |
| H03L 7/00 | (2006.01) | |
| H03M 1/08 | (2006.01) | |
| H03L 7/091 | (2006.01) | |
| H03M 1/00 | (2006.01) | |

(52) U.S. Cl.
CPC ......... *H03M 1/126* (2013.01); *H03M 1/1215* (2013.01); *H03M 1/1245* (2013.01); *Y10T 307/76* (2015.04)

(56) References Cited

U.S. PATENT DOCUMENTS

| | | | |
|---|---|---|---|
| 5,579,006 A | 11/1996 | Hasegawa et al. | |
| 5,886,562 A | 3/1999 | Garrity et al. | |
| 5,917,363 A | 6/1999 | Jandu et al. | |
| 6,407,687 B2 | 6/2002 | Martin et al. | |
| 6,982,664 B1 | 1/2006 | Nairn | |
| 7,015,729 B1 | 3/2006 | Tursi et al. | |
| 7,579,896 B2 | 8/2009 | Faust et al. | |
| 7,649,485 B1 * | 1/2010 | Kaplan | H03M 1/121 341/155 |
| 7,760,127 B2 * | 7/2010 | Sutardja | H03M 1/1019 341/155 |
| 2003/0132870 A1 | 7/2003 | Azadet | |
| 2005/0285770 A1 | 12/2005 | Ye | |
| 2006/0170581 A1 | 8/2006 | Lin | |
| 2008/0001806 A1 | 1/2008 | Uchino | |
| 2009/0196384 A1 | 8/2009 | Staszewski et al. | |
| 2010/0208789 A1 | 8/2010 | Cooke | |

FOREIGN PATENT DOCUMENTS

| | | |
|---|---|---|
| EP | 1 729 420 A1 | 12/2006 |
| EP | 2 023 487 A1 | 2/2009 |
| FR | 2476412 A1 | 8/1981 |
| JP | S62-149224 A | 7/1987 |
| JP | H06-296138 A | 10/1994 |
| JP | 2000-341123 A | 12/2000 |
| JP | 2003-133954 A | 5/2003 |
| JP | 2008-090422 A | 4/2008 |
| WO | WO 2008/082835 A1 | 7/2008 |

OTHER PUBLICATIONS

Chinese First Office Action dated Feb. 4, 2015 issued in Chinese Patent Application No. 201210470035.2 (with translation).
Chinese First Office Action dated May 6, 2015 issued in Chinese Patent Application No. 201210469757.6 (with translation).
European Office Action in EP Application SN 10180216.3-2206/2267902, dated May 16, 2012.
European Search Report dated Jul. 11, 2012.
European Search Report dated Jul. 9, 2012.
Japanese Office Action dated Aug. 19, 2014 issued in Japanese Patent Application No. 2013-273042.
Japanese Office Action dated Aug. 19, 2014 issued in Japanese Patent Application No. 2013-273509.
K. Poulton; J.J. Corcoran; T. Hornak: A 1-GHz 6-bit ADC System: IEEE Journal of Solid-State Circuits vol. 22, Dec. 1987, pp. 962-970.
L. Richard Carley et al., "High-Speed Low-Power Integrating CMOS Sample-and Hold Amplifier Architecture", IEEE 1995 Custom Integrated Circuits Conference, 1995, pp. 543-546, Pittsburgh, PA.
Neeraj Nayak, et al., "A Comparison of Transient Digitization Methods for High Speed Analog Signals," Analog and Mixed Signal VLSI Design Center, May 2001, vol. 1, IEEE International Symposium on Circuits and Systems, New York, NY.
Paul W. Juodawlkis et al., "Optical Sampling for High-Speed, High-Resolution Analog-to-Digital Converters", International Topical Meeting on Microwave Photonics, MWP 2003 Proceedings, International Topical Meeting on Budapest, Sep. 10-12, 2003, pp. 75-50, Piscataway, NJ, USA.
Paul W. Juodawlkis et al., "Optically Sampled Analog-to-Digital Converters", IEEE Transactions on Microwave Theory and Techniques, Oct. 10, 2001, pp. 1844-1846, vol. 49, No. 10, IEEE Service Center, Piscatawawy, NJ, USA.
Peter Schvan, et al., A 24GS/s 6b ADC in 90nm CMOS, Solid-State Circuits Conterence, 2008. ISSCC 2008. Digest of Technical Papers, Feb. 3, 2008, pp. 544, 545, and 634, IEEE International, IEEE Piscataway, NJ, USA.
Samad Sheikhaei, et al., "A 4-Bit 5GS/s Flash A/D Converter in 0.18um CMOS," Circuit and Systems, 2005, ISCAS 2005, IEEE International Symposium O N Kobe Japan, May 23, 2005, pp. 6138-6141, IEEE, Piscataway, NJ, USA.
U.S. Office Action dated Mar. 29, 2013, issued in counterpart U.S. Appl. No. 13/712,494.
W. C. Black, Jr.; D.A. Hodges: "Time-Interleaved Converter Arrays" IEEE Journal of Solid-State Circuits vol. 15, Dec. 1980, pp. 1022-1029.

* cited by examiner

ANALOGUE-TO-DIGITAL CONVERSION CIRCUITRY

CROSS-REFERENCED TO RELATED APPLICATIONS

This is a Divisional Application of U.S. application Ser. No. 13/712,740, filed Dec. 12, 2012, which is a Divisional Application of U.S. patent application Ser. No. 12/686,757, filed Jan. 13, 2010, which claims priority to European Patent Application No. 09250202.0, filed Jan. 26, 2009, the disclosure of the prior applications of each of which are incorporated in their entirety by reference.

The present invention relates to circuitry and methods for sampling an input signal, for example for sampling an input analogue signal. In particular, but not exclusively, the present invention relates to analogue-to-digital circuitry and methods.

Architectures for realising analogue-to-digital converters (ADCs) generally fall into one of three categories, namely low-to-medium speed (e.g. integrating and oversampling ADCs), medium speed (e.g. algorithmic ADCs) and high speed (e.g. time-interleaved ADCs). Typically, as the speed of ADCs increase, their accuracy is found to fall.

The main idea behind time-interleaved ADCs is to obtain very-high-speed analogue-to-digital conversion by operating many sub-ADCs in parallel. Examples of known time-interleaved ADCs are disclosed in "Time-Interleaved Converter Arrays" by W. C. Black, Jr. and D. A. Hodges, IEEE Journal of Solid-State Circuits, Volume 15, pages 1022 to 1029, December 1980, and in "A 1-GHz 6-bit ADC System", by K. Poulton, J. J. Corcoran, and T. Hornak, IEEE Journal of Solid-State Circuits, Volume 22, pages 962 to 970, December 1987.

FIG. 1 is a schematic diagram of a time-interleaved ADC 1 which may be considered generally equivalent to the known examples cited above. ADC 1 comprises a first sample-and-hold (S/H) circuit 2, four second S/H circuits 4, four N-bit ADCs 6 and a digital multiplexer 8.

The first S/H circuit 2 is controlled by clock $\theta_0$ and the second S/H circuits 4 are controlled by clocks $\theta_1$ to $\theta_4$. Clock $\theta_0$ is four times as fast as clocks $\theta_1$ to $\theta_4$ and clocks $\theta_1$ to $\theta_4$ are delayed relative to one another by the period of clock $\theta_0$. Thus, the ADCs 6 receive samples of the input signal $V_{IN}$ sampled at the rate of clock $\theta_0$ in turn, so that the samples received by one ADC 6 are time-interleaved with samples received by the other ADCs 6. The benefit of this approach is that the four ADCs 6 can operate at a quarter of the rate of the input sampling frequency.

The digital outputs of the ADCs 6 are multiplexed together in the digital multiplexer 8 and output as a digital signal representative of the original analogue input signal $V_{IN}$ input to the first S/H circuit 2.

Clearly, the first S/H circuit 2 is critical (because of the frequency at which it must operate), whereas it is possible to tolerate considerable jitter (phase noise) in the four second S/H circuits 4 because the samples have already been taken at that point. As a result, the first S/H circuit 2 is sometimes realised off-silicon for improved performance, for example using GaAs technology.

An improved time-interleaved ADC is disclosed in "A 24 GS/s 6b ADC in 90 nm CMOS", by Peter Schvan et al, ISSCC 2008, Session 30, Data-Converter Techniques, 30.3, 2008 IEEE International Solid-State Circuits Conference, pages 544, 545, and 634. FIG. 2 is a schematic diagram of a time-interleaved ADC 10, which may be considered generally equivalent to the ADC disclosed in this ISSCC paper.

The ADC 10 comprises four track-and-hold (T/H) circuits, four ADC banks 14, four demultiplexers 16, and a digital multiplexer 18. The overall architecture of the ADC 10 is comparable to that of ADC 1. In this way, the T/H circuits 12 operate in a time-interleaved fashion and at a quarter of the overall sampling frequency.

ADC banks 14 are employed to convert the received samples into digital signals. ADC banks 14 may each comprise a plurality of time-interleaved sub-ADC circuits so as to enable those ADC circuits to operate at a yet slower rate than the T/H circuits 12, thereby demultiplexing each of the incoming signals into a plurality of output signals. Further demultiplexing may be carried out by demultiplexers 16. The digital outputs of the demultiplexers 16 are finally multiplexed together in the digital multiplexer 18 and output as a digital signal representative of the original analogue input signal $V_{IN}$ input to the T/H circuits 12.

It will therefore be appreciated that the existing architecture for an ultra-high-speed ADC such as ADC 10 of FIG. 2 is an array of interleaved T/H circuits to take initial samples, followed by demultiplexing/sample-and-hold circuits which drive an array of low-speed sub-ADCs. This existing ADC circuitry is voltage-mode circuitry.

One problem with this architecture is that it is particularly difficult (if not impossible) to obtain gain and skew (sample time) matching between the different front-end T/H channels, gain matching between the different demultiplexer/sample-and-hold channels and gain/linearity/offset matching between the sub-ADCs. Any mismatches appear as spurs and images in the frequency domain or as fixed-patterned noise in the time domain. Even if some means of trimming the sampling delays can be provided, the difficulty of measuring these delay errors remains, because those errors are far too small to be measured directly.

A further problem is in achieving enough speed and linearity out of the front end T/H circuits, because these need to have very high bandwidth and low distortion. The issue is not just static linearity but also dynamic linearity in the sampling switches, because any signal-dependent switching delay introduces distortion on high-frequency input signals.

Another major problem is that to get high speed, low capacitance and lower power in the sampling gates, very small devices must be used, which means that random mismatches are very large and difficult to compensate for. It is also difficult to get good input matching at high frequencies, and there is significant signal-dependent switching kickback which causes distortion.

To provide an idea of the design difficulty involved, to maintain an ENOB (Effective Number of Bits) of 6 bits for a 20 GHz input signal, the T/H sampling times need to be interleaved to within 0.1 ps accuracy of the ideal sample instance. This is impossible to do by design, so calibration is needed. However, the times cannot be measured directly with enough accuracy, e.g. by measuring clock-delay differences, so a calibration signal generally needs to be applied to enable the timing to be tuned (in very small steps) by minimizing FFT spurs. Even if this can be done, generating and distributing the multiple high-speed sampling clocks and providing fine-delay time adjustments is also difficult and consumes a lot of power.

For a better understanding, the above problems in existing time-interleaved ADCs such as ADC 10 of FIG. 2 will be considered in more detail.

FIG. 3 is a schematic diagram of circuitry 20 which may be employed in T/H circuits 12 of ADC 10. Circuitry 20 comprises a resistance 21, a transistor 22, a clock buffer 24, a signal buffer 26, and a capacitor 28. Typically, an analogue input voltage $V_{IN}$ is sampled by being gated through the transistor 22 under control of a clock signal CLK, and this sampled voltage is temporarily stored on capacitor 28 before being employed by the rest of the circuitry via buffer 26.

A desire to operate such circuitry at a high sample rate places considerable pressure on its operation. For example, in order to operate at a desired sample rate of 56 GS/s the width of the clock pulses may need to be in the order of 17 ps (as indicated in FIG. 3).

Such fast operation also necessitates a small transistor 22 (e.g. having a gate area of less than 1 square micron), and a small capacitor 28 (e.g. having a capacitance C in the order of a few fF). At these small sizes, mismatch in the transistors 22 (for example, in the parasitic capacitances and on-resistances $R_{ON}$), and in the capacitors 28 between the different sampling circuits 20 of the ADC, becomes significant.

Moreover, resistance 21 is generally provided to give a desired input impedance (e.g. 500), and to maintain good input matching the impedance of the capacitor 28 must be much higher (e.g. 10 times) than that of the resistance 21 at the frequency of interest. For example, at 20 GHz for an impedance of 500Ω, the capacitor 28 may need to have a capacitance in the region of 16 fF. At this tiny size, mismatches between the capacitors 28 of the T/H circuits can become very significant.

Furthermore, with such a high clock rate, the slew rate becomes significant. FIG. 4 is an enlarged diagram of a clock signal as it falls from its high level $V_{DD}$ (digital "1") to its low level $V_{SS}$ (digital "0"). Also shown in FIG. 4 is an example input signal $V_{IN}$ fluctuating between maximum and minimum signal values. Although the signals in FIG. 4 are not shown to scale, it will be appreciated that over the range of possible input values of the signal $V_{IN}$ (the maximum, middle-point and minimum values are indicated by black dots), there will be a corresponding range in values of the clock signal CLK at which the transistor 22 will switch (again, the corresponding maximum, middle and minimum such values are indicated by black dots). This is because the switching point of a transistor depends on the gate-source voltage $V_{GS}$ which is dependent upon $V_{CLK}-V_{IN}$. This range in clock signal CLK values leads to an input-signal ($V_{IN}$) dependent range of switching timing errors ΔT as shown in FIG. 4.

FIG. 5 is a diagram useful for further understanding the effect of such slew-rate-related and input-dependent timing errors. The clock signal CLK is shown as a perfect sinewave, together with a schematic indication of the clock skew on the falling edges thereof (the falling edge is assumed to be critical and, for simplicity, slew on the rising edge is not indicated).

Along the input signal ($V_{IN}$) waveform shown in the lower half of FIG. 5, black dots represent the intended sample points corresponding to the falling clock edges in the clock waveform above. However, it will be appreciated by comparison with FIG. 4, and assuming that the circuitry is designed to take samples correctly when the input signal $V_{IN}$ is at the mid-point of its range, that the samples taken when $V_{IN}$ is in the positive half of its range will be taken early by an input-signal dependent amount and, conversely, that the samples taken when $V_{IN}$ is in the negative half of its range will be taken late, again by an input-signal dependent amount. Clock skew, phase noise (jitter), amplitude noise, and mismatching of transistors and capacitors compound these problems, leading to high distortion, i.e. a low ENOB, in the eventual ADC output.

The effects of such mismatches, and such clock slew, skew and jitter, can be summarized as causing delay mismatch (mainly caused by the clock generation and sampling circuitry), gain mismatch (mainly caused by the sampling and demultiplexing circuitry) and roll-off or bandwidth mismatch (again, mainly caused by the sampling and demultiplexing circuitry).

FIG. 6 is a frequency-response diagram indicating the effects of gain mismatch G and roll-off mismatch R. Such mismatches can mean that the overall frequency response of the ADC is unpredictable.

Another issue with the FIG. 2 ADC architecture relates to the issue of calibration. It is theoretically possible to apply a known test signal to the ADC and to examine the output of the ADC to aid calibration. The output signal may for example be examined by performing an FFT and then examining the resulting frequency response. For example, with the desired 56 GS/s ADC in mind, FIG. 7 shows, in its upper half, an example ideal output FFT trace given an overall ADC sampling frequency of 56 GHz and therefore an overall ADC Nyquist frequency of 28 GHz. For this example, four-way sampler interleaving is assumed, with each sampler operating at a sampling frequency of 14 GHz, i.e. one quarter of 56 GHz.

A test signal at 1 GHz is assumed to be applied to the input of the ADC in the absence of any other signal. Accordingly, a trace at 1 GHz is seen in the upper graph of FIG. 7, together with images thereof about the 14, 28, 42 and 56 GHz frequencies, as would be expected.

Calibration can thus theoretically be performed by applying the test signal and carrying out calibration to achieve the desired frequency response. However, FFT processing is costly in terms of processing time, power consumption and complexity. Furthermore, during operation the sample circuits do not receive signals with a simple frequency response as in the upper graph for FIG. 7. Instead, an input signal during operation will have a frequency spectrum as shown in the lower graph of FIG. 7. Performing calibration during operation could thus be prohibitively complex, forcing calibration to be carried out whilst the ADC is off-line. It is undesirable to need to take an ADC (for example in use in an Ethernet connection) off-line to perform calibration.

A paper entitled "High-Speed Low-Power Integrating CMOS Sample-and-Hold Amplifier Architecture", by L. Richard Carley and Tamal Muckherjee, IEEE 1995 Custom Integrated Circuits Conference, pages 543 to 546, discloses a "current-mode" sampling architecture for sample-and-hold (S&H) amplifiers which results in a reduction in error due to sampling clock jitter and aperture time. These reduced errors make possible a reduction in power over a conventional "voltage-mode" S&H with the same sample rate. This sampler uses switched logic-level clocks to drive the circuitry in an attempt to get "square" ideal sampling pulses. It also uses a transconductance stage to perform V-I conversion, which causes the circuitry to suffer from noise and distortion. The input impedance of the transconductor gate is capacitive, which means that input-matching performance of the circuitry is poor.

It is desirable to solve one or more of the above-mentioned problems. It is desirable to provide sampling and analogue-to-digital conversion circuits, methods and techniques which enable one or more of improved distortion performance, reduced power consumption, reduced circuit size, and increased sampling rate.

According to an embodiment of a first aspect of the present invention, there is provided current-mode circuitry for sampling a current signal, the circuitry comprising: a first node configured to have the current signal applied thereto; X second nodes conductively connectable to said first node along respective paths; and steering means for controlling such connections between the first node and the second nodes so that different packets of charge making up said current signal are steered along different said paths over time, wherein: X is an integer greater than or equal to 3; and the steering means comprises: control-signal generating means configured to generate X time-interleaved sinusoidal control signals; and switching means distributed along said paths and configured to carry out such control in dependence upon the X sinusoidal control signals.

Embodiments of the present invention carry out sampling based upon currents, i.e. in the current domain. That is, in embodiments of the present invention, any information content stored in the signals is represented by the current level of those signals. In the operation of such circuitry, current is the independent variable and voltage is dependent on the current; current is the cause and voltage is the effect. Such embodiments may be incorporated into, or employed in conjunction with, voltage-mode circuitry.

When X (where X≥3) paths are controlled with a corresponding X time-interleaved control signals, it may (with previously-considered circuitry in mind) be considered appropriate to employ switched logic-level clock signals as those control signals. Such clock signals may for example be considered hard-switched clock signals or square-wave-type clock signals. In that case, it would be necessary to employ clock signals each having a 100/X % duty cycle to achieve the required 100/X % duty-cycle pulses to control the X paths. For example, when X=4, it would be necessary to employ clock signals each having a 25% duty cycle to achieve the required 25% duty-cycle pulses to control the four paths. The use of such control signals may mean that the circuitry is difficult if not impossible to use at high frequency (e.g. at 10 GHz+).

In contrast, in embodiments of the present aspect of the present invention, the X time-interleaved control signals are sinusoidal control signals. As a result, it becomes possible for 100/X % duty-cycle pulses to be provided for controlling the X paths, but with each control signal itself having a shape typical of a 50% duty cycle (as is naturally true of sinusoidal signals). For example, when X=4 it becomes possible to employ 4 time-interleaved sinusoidal control signals, each having a 50% duty cycle, to form 25% duty-cycle pulses to control the four paths. By using the sinusoidal control signals, the pressures on control-signal generation are relaxed, which is particularly advantageous when considering high-frequency operation. At a particular frequency of operation (e.g. sample rate, which may be the rate at which such packets of charge are generated), a square-wave-type switched logic-level clock signal requires much higher frequency components than the sinusoidal control signals of the present aspect. Put another way, at a particular fundamental frequency of control signal, a sinusoidal signal (e.g. a raised cosine signal) has a low slew rate and is the only signal that only has content at the fundamental frequency.

The following are optional features relating to the present aspect, however those features may be provided in combination with features of the other circuitry aspects disclosed herein.

The control signals may be raised generally cosine signals. For example, the shape of the signals may only need to be close to that of a perfect raised cosine signal in the upper part of the signals. The control signals may be substantially evenly time-interleaved relative to one another.

In an advantageous embodiment, X may equal 4. This may, for example, enable ease of compatibility with a quadrature VCO (a convenient generator of the control signals).

The steering means may be configured such that each of the X paths is controlled by a different one of said X control signals. For example, the steering means may be configured such that each of the X paths is substantially conductive when its control signal is at or around its maximum value, and is substantially non-conductive when its control signal is at or around its minimum value. The steering means may be configured such that when two of said control signals have the same value their corresponding paths have substantially the same level of conductivity.

The switching means may comprise a transistor per path, and, for each path, the transistor concerned may be connected such that its channel forms part of that path and such that it is controlled by the control signal for that path. This may provide a convenient way to control the conductivity of the paths. The transistors may be MOSFETs having gate terminals, and, for each path, the gate terminal of the transistor concerned may be connected to receive the control signal for that path.

The circuitry may further comprise an input node operable to receive an input voltage signal, and conversion means connected between the input node and the first node for converting the input voltage signal into the current signal, the conversion means being configured as passive circuitry comprising a resistance for performing the conversion. This may advantageously enable the circuitry to be supplied a voltage signal (which is a more convenient input signal), despite it operating in current mode.

When performing V-I conversion in order to convert a supplied input voltage signal into a required current signal, it may be considered appropriate (with previously-considered circuitry in mind) to employ a transconductance stage (i.e. an active V-I conversion circuit). A transconductance stage can be useful for providing a true V-I conversion, for example even if there is voltage ripple at the node to which the current signal is to be applied. However, the input impedance of such a transconductance stage tends to be capacitive (transconductor gate), and thus has a bandwidth limit in its operation. The use of such a transconductance can thus be highly problematic at high frequency (e.g. at 10 GHz+). At high frequency, a transconductance stage can become a significant noise and distortion contributor, and it can become very difficult to achieve satisfactory input matching.

In embodiments of the present aspect of the present invention, a resistance is provided between the input node and the first node as part of passive conversion means, to convert the input voltage signal to the current signal. This is in contrast to the above previously-considered thinking that it is appropriate to employ an active transconductance stage. Such passive conversion means may be configured to have a resistive input impedance, and thus the passive V-I conversion stage of the present aspect may be employed at very high frequencies without contributing significant noise or distortion, as constant input impedance can be achieved. In practical embodiments of the present aspect, it has been found that voltage ripple at the first node is small enough to still enable a sufficiently high degree of linearity to be achieved.

The conversion means may comprise a resistor network having the resistance and configured such that the input node has substantially constant input impedance over frequency. The first node may have a capacitive input impedance, for example due to parasitic capacitance on that node, and the network may comprise an inductance configured to compensate for the capacitive input impedance at the first node.

The network may be configured such that an effect of a voltage fluctuation at said first node on conversion of the input voltage signal into the current signal is scaled down. For example, the network may have a potential-divider configuration to perform such scaling down.

The circuitry may comprise means for generating sample values based upon a characteristic of respective such charge packets passing through said second nodes, the sample values being indicative of values of said current signal corresponding to the charge packets concerned. Such a characteristic may, for example, be a peak value of the packets or an area of (i.e. an amount of charge making up) the packets. Such sample values may, for example, be digital sample values, which may be output to a digital signal processor (DSP), or other computing device.

The circuitry may comprise calibrating means operable to combine sample values from one or more of said second nodes to provide one or more combined sample values, and to calibrate operation of the circuitry in dependence upon said combined sample value(s).

Over time, statistically speaking, it could be expected that a combination (e.g. an average) of the sample values passing through one of the second nodes would be the same a such a combination of the sample values passing through another one of the second nodes. This assumes that the current signal is carrying an information signal such as a typical data signal whose value is changing (pseudo-randomly) over time. This also assumes that the circuitry is operating correctly.

Thus, assuming that the current signal is indeed carrying such an information signal, then any differences between the combinations of sample values as mentioned above, or between a combination and a reference value, may be symptomatic of errors in the operation of the circuitry, and such differences may advantageously be employed to control operation of the circuitry to reduce or eliminate such errors (i.e. to calibrate operation of the circuitry).

Because such calibration makes use of "real" sample values, i.e. sample values generated from an applied information signal when the circuitry is in use, the calibration may be performed whilst the circuitry is in active use, i.e. without taking it "off-stream" or "off-line" to perform the calibration.

The calibration means may be operable to combine sample values for a said second node over time to create a combined sample value for that node, and to calibrate operation of the circuitry in dependence upon a comparison between that combined sample value and a reference value. Such combination may, for example, be a summation or an averaging combination.

The calibration means may be operable to combine sample values for one said second node over time to create a combined sample value for that node, to combine sample values for another said second node over time to create a combined sample value for that other node, and to calibrate operation of the circuitry in dependence upon a comparison between those combined sample values. The calibration means may be operable, for each said second node, to combine sample values for that second node over time to create a combined sample value, and to calibrate operation of the circuitry in dependence upon a comparison between those combined sample values. Such comparisons may, for example, comprise looking for differences between said combined sample values, and looking at the relationships between those differences for different combinations of said second nodes.

The calibration means may be operable to influence operation of the control-signal generating means and/or the switching means so as to perform such calibration.

For example, the calibration means may be operable to control the phase and/or magnitude of the control signals so as to perform said calibration. In one embodiment, the steering means is configured such that the conductive connection of each said second node to the first node is controlled by its said control signal; the calibration means is operable to combine sample values for one candidate said second node over time to provide a combined sample value for that node, and to combine sample values for another candidate said second node over time to provide a combined sample value for that other node; and the calibration means is operable to control the phase and/or magnitude of the control signal for one or both of those candidate nodes to compensate for any difference between the combined sample values for those candidate nodes.

As another example, the calibration means may be operable to control a dependency of said switching means on said control signals so as to perform said calibration. In one embodiment, the switching means comprises a transistor per path; for each path, the transistor concerned is connected such that its channel forms part of that path and such that it is controlled by the control signal for the second node of that path; the calibration means is operable to combine sample values for one candidate said second node over time to provide a combined sample value for that node, and to combine sample values for another candidate said second node over time to provide a combined sample value for that other node; and the calibration means is operable to control a gate and/or bulk voltage for the transistor along the path for one or both of those candidate nodes to compensate for any difference between the combined sample values for those candidate nodes.

The circuitry may comprise calibrating means operable analyse the or some of the sample values and to calibrate operation of the circuitry in dependence upon such analysis.

In previously-considered circuitry, control signals for use by switching means tend to be clock signals with fast clock edges, for example switched logic-level clock signals such as square waves. In this way, the switching operations of the switching means are desensitised or shielded from the effects of mismatches between different switches of the switching means and to mismatches between different control signals used to control the switching means.

In contrast, embodiments of the present aspect of the present invention employ sinusoidal control signals. The magnitude of a sinusoidal signal changes very slowly over time from its maximum to its minimum. That is, for a control signal having a particular fundamental frequency, a sinusoidal signal has a low slew rate and is the only signal that only has content at the fundamental frequency. In this way, it is possible to maximise the sensitivity of the switching operations of the switching means to mismatches between different switches of the switching means and to mismatches between different control signals used to control the switching means. Put another way, by employing sinusoidal signals it may be possible to maximise the gain from a change in mismatch to a change in the output sample value. This sensitivity may advantageously be employed to calibrate operation of the circuitry to compensate for the mismatches. That is, it may be possible to analyse the sample values and calibrate operation based on the analysis.

The circuitry may be configured to have a tree structure, wherein: the first node is a root node of the tree structure; the second nodes are first-tier nodes of the tree structure each of which is conductively connectable directly to the root node; the circuitry further comprises a plurality of subsequent-tier nodes of the tree structure per first-tier node, each of which is conductively connectable indirectly to the root node along a respective path via its said first-tier node; and the steering means is operable to control such connections between the root node and the subsequent-tier nodes so that different packets of charge making up said current signal are steered along different said paths over time.

By arranging nodes in a tree structure (having a root node, first-tier nodes, and subsequent-tier-nodes per first-tier-node, with switches making up the switching means distributed between the nodes along the paths), it is possible to allow the specifications for the switching performed to become successively more relaxed from tier to subsequent tier. For example, assuming that the paths from the root node to the first-tier nodes are cycled through (for carrying packets) in an order or sequence, and assuming that there are X first tier-nodes, then the rate at which packets pass through a first-tier node is 1/X the rate at which packets pass through the root node. Further, extending this example through the next tier of nodes (part or all of the subsequent tier-nodes), then assuming that there are N second-tier nodes per first-tier node, the rate at which packets pass through a second-tier node is 1/N the rate which packets pass through its first-tier node, and 1/(X·N) the rate at which packets through the root node.

In one embodiment, the steering means is operable to employ said sinusoidal control signals to control connections between the root node and the first-tier nodes; the control-signal generating means is operable to generate a plurality of time-interleaved switched-logic control signals; and the steering means is operable to employ the switched-logic control signals to control connections between the first-tier nodes and the subsequent-tier nodes. The control signals used to control connections between the first-tier of nodes and the subsequent-tier of nodes may have larger peak-to-peak voltages and/or longer on-times than that of the control signals used to control connections between the root node and the first-tier of nodes.

The generating means may be operable to generate sample values based upon a characteristic of respective such charge packets passing through said subsequent-tier nodes, the sample values being indicative of values of said current signal corresponding to the charge packets concerned.

The circuitry may comprise reset means connected to a said node other than the first node, and operable, during a period between packets for that node, to tend to bring a voltage potential of that node to a predetermined value.

By bringing a voltage potential at a node to a predetermined value, during a period between packets for that node, it may be possible to reduce errors which may otherwise result from differing amounts of residual charge (for example, from previous charge packets) stored on a parasitic capacitance at that node. In one embodiment, the reset means may be operable to cause the voltage potential of that node to return to the same value between successive packets for that node.

The circuitry may comprise a plurality of said reset means each for a different such node other than the first node. The may be a said reset means per each such node other than the first node. The value that the voltage potential of each such node is caused to return to may be different for each node, or substantially the same for each node.

The circuitry may be configured for sampling first and second complementary said current signals. In one embodiment, the circuitry comprises first and second complementary circuit portions, the first portion for sampling the first current signal and the second portion for sampling the second current signal. Each such portion may comprise such a first node, second nodes and steering means, and the circuitry may further comprise reset means connected to at least one of a said second node of the first portion and the complementary node of the second portion, and operable, during a period between packets for that pair of complementary nodes, to tend to bring a difference in voltage potential between those two nodes to a predetermined value.

By bringing a difference in the voltage potential between pairs of complementary nodes to a predetermined value, during a period between packets for those nodes, it may be possible to reduce errors which may otherwise result from differing amounts of residual charge (for example, from previous charge packets) stored on parasitic capacitances of those nodes.

The reset means may be connected to both nodes of the pair of complementary nodes. The reset means may be operable to connect the or both of the nodes of the pair of complementary nodes to (for example, via a capacitor) a reference potential, e.g. a ground supply, so as to tend to bring the difference in potential to a predetermined value. The reset means may be operable to bring the nodes of the pair of complementary nodes to the same potential as one another. The reset means may be connected between the pair of complementary nodes, and may be operable to connect those nodes together so as to bring those nodes to the same potential as one another. The reset means may be operable to cause a voltage potential of the or both (each) of the nodes of the pair of complementary nodes to return to the same value between successive packets. There may be provided a plurality of such reset means each for a different such pair of complementary nodes.

Each portion may comprise generating means for generating sample values based upon a characteristic of respective such charge packets passing through the second nodes of that portion, the sample values being indicative of values of the current signal of that portion corresponding to the charge packets concerned.

The circuitry may be configured for sampling first and second complementary said current signals. For example, the circuitry may comprise first and second complementary circuit portions, the first portion for sampling the first current signal and the second portion for sampling the second current signal. In one embodiment, each said portion comprises such a first node, second nodes and steering means, each said portion is configured in a tree structure, and, for each said portion, the first node is a root node of the tree structure, the second nodes are first-tier nodes of the tree structure each of which is conductively connectable directly to the root node of that portion, and that portion further comprises a plurality of subsequent-tier nodes of its tree structure per first-tier node, each of which is conductively connectable indirectly to the root node of that portion along a respective path via its said first-tier node. In such an embodiment, the steering means may be operable to control such connections between the root node and the subsequent-tier nodes so that different packets of charge making up said current signal are steered along different said paths over time. In such an embodiment, the circuitry may further comprise reset means connected to at least one of a said first or subsequent-tier node of the first portion and the complementary node of the second portion, and operable, during a period between packets for that pair of complementary nodes, to tend to bring a difference in potential between those two nodes to a predetermined value.

The reset means may be connected to both nodes of the pair of complementary nodes. The reset means may be operable to connect the or both of the nodes of the pair of complementary nodes to (for example, via a capacitor) a reference potential, e.g. a ground supply, so as to tend to bring the difference in potential to a predetermined value. The reset means may be operable to bring the nodes of the pair of complementary nodes to the same potential as one another. The reset means may be connected between the pair of complementary nodes, and may be operable to connect those nodes together so as to bring those nodes to the same potential as one another. The reset means may be operable to cause a voltage potential of the or both (each) of the nodes of the pair of complementary nodes to return to the same value between successive packets. There may be provided a plurality of such reset means each for a different such pair of complementary nodes.

The circuitry may comprise generating means for generating sample values based upon a characteristic of respective such charge packets passing through the subsequent-tier nodes of that portion, the sample values being indicative of values of the current signal of that portion corresponding to the charge packets concerned.

According to an embodiment of a second aspect of the present invention, there is provided current-mode circuitry for sampling a current signal, the circuitry comprising: a first node configured to have the current signal applied thereto; a plurality of second nodes conductively connectable to said first node along respective paths; steering means for controlling such connections between the first node and the second nodes so that different packets of charge making up said current signal are steered along different said paths over time; generating means for generating sample values based upon a characteristic of respective such charge packets passing through said second nodes, the sample values being indicative of values of said current signal corresponding to the charge packets concerned; and calibrating means operable to combine sample values from one or more of said second nodes to provide one or more combined sample values, and to calibrate operation of the circuitry in dependence upon said combined sample value(s).

Such combination may be, for example, through summation or averaging.

Over time, statistically speaking, it may be expected that a combination (e.g. an average) of the sample values passing through one of the second nodes would be the same a such a combination of the sample values passing through another one of the second nodes. This assumes that the current signal is carrying an information signal such as a typical data signal whose value is changing (pseudo-randomly) over time. This also assumes that the circuitry is operating correctly.

Thus, assuming that the current signal is indeed carrying such an information signal, then any differences between the combinations of sample values as mentioned above, or between a combination and a reference value, may be symptomatic of errors in the operation of the circuitry, and such differences may advantageously be employed to control operation of the circuitry to reduce or eliminate such errors (i.e. to calibrate operation of the circuitry).

Because such calibration makes use of "real" sample values, i.e. sample values generated from an applied information signal when the circuitry is in use, the calibration may be performed whilst the circuitry is in active use, i.e. without taking it "off-stream" to perform the calibration.

The following are optional features relating to the present aspect, however those features may be provided in combination with features of the other circuitry aspects disclosed herein.

The calibration means may be operable to combine sample values for a said second node over time to create a combined sample value for that node, and to calibrate operation of the circuitry in dependence upon a comparison between that combined sample value and a reference value. The calibration means may be operable to combine sample values for one said second node over time to create a combined sample value for that node, and to combine sample values for another said second node over time to create a combined sample value for that other node, and to calibrate operation of the circuitry in dependence upon a comparison between those combined sample values. The calibration means may be operable, for each said second node, to combine sample values for that second node over time to create a combined sample value, and to calibrate operation of the circuitry in dependence upon a comparison between those combined sample values. Such comparisons may, for example, comprise looking for differences between said combined sample values, and looking at the relationships between those differences for different combinations of said second nodes.

The steering means may comprise: control-signal generating means configured to generate a set of time-interleaved control signals, one for each said second node; and switching means distributed along said paths and configured to carry out such control of the connections in dependence upon the control signals. In that case, the calibration means may be operable to influence operation of the control-signal generating means and/or the switching means so as to perform such calibration.

The calibration means may be operable to control the phase and/or magnitude of the control signals so as to perform said calibration. In one embodiment, it may be that: the steering means is configured such that the conductive connection of each said second node to the first node is controlled by its said control signal; the calibration means is operable to combine sample values for one candidate said second node over time to provide a combined sample value for that node, and to combine sample values for another candidate said second node over time to provide a combined sample value for that other node; and the calibration means is operable to control the phase and/or magnitude of the control signal for one or both of those candidate nodes to compensate for any difference between the combined sample values for those candidate nodes.

The calibration means may be operable to control a dependency of said switching means on said control signals so as to perform said calibration. In one embodiment, it may be that: the switching means comprises a transistor per path; for each path, the transistor concerned is connected such that its channel forms part of that path and such that it is controlled by the control signal for the second node of that path; the calibration means is operable to combine sample values for one candidate said second node over time to provide a combined sample value for that node, and to combine sample values for another candidate said second node over time to provide a combined sample value for that other node; and the calibration means is operable to control a gate and/or bulk voltage for the transistor along the path for one or both of those candidate nodes to compensate for any difference between the combined sample values for those candidate nodes.

According to an embodiment of a third aspect of the present invention, there is provided current-mode circuitry for sampling a current signal, the circuitry comprising: a first node configured to have the current signal applied thereto; a plurality of second nodes conductively connectable to said first node along respective paths; steering means for controlling such connections between the first node and the second nodes so that different packets of charge making up said current signal are steered along different said paths over time; and generating means for generating sample values based upon a characteristic of respective such charge packets passing through said second nodes, the sample values being indicative of values of said current signal corresponding to the charge packets concerned, wherein: the steering means comprises control-signal generating means configured to generate substantially sinusoidal control signals, and switching means distributed along said paths and configured to carry out such control in dependence upon the sinusoidal control signals; and the circuitry further comprises calibrating means operable analyse the or some of the sample values and to calibrate operation of the circuitry in dependence upon such analysis.

In previously-considered circuitry, control signals for use by switching means tend to be clock signals with fast clock edges, for example switched logic-level clock signals such as square waves. In this way, the switching operations of the switching means are desensitised or shielded from the effects of mismatches between different switches of the switching means and to mismatches between different control signals used to control the switching means.

In contrast, embodiments of the present aspect of the present invention employ sinusoidal control signals. The magnitude of a sinusoidal signal changes very slowly over time from its maximum to its minimum. That is, for a control signal having a particular fundamental frequency, a sinusoidal signal has a low slew rate and is the only signal that only has content at the fundamental frequency. In this way, it is possible to maximise the sensitivity of the switching operations of the switching means to mismatches between different switches of the switching means and to mismatches between different control signals used to control the switching means. Put another way, by employing sinusoidal signals it is possible to maximise the gain from a change in mismatch to a change in the output sample value. This sensitivity may advantageously be employed to calibrate operation of the circuitry to compensate for the mismatches. That is, it is possible to analyse the sample values and calibrate operation based on the analysis.

The following are optional features relating to the present aspect, however those features may be provided in combination with features of the other circuitry aspects disclosed herein.

The calibration means may be operable to influence operation of the control-signal generating means and/or the switching means so as to perform such calibration, as mentioned above.

According to an embodiment of a fourth aspect of the present invention, there is provided current-mode circuitry for sampling a current signal, the circuitry comprising: a root node configured to have the current signal applied thereto; a plurality of first-tier nodes each of which is conductively connectable directly to the root node; a plurality of subsequent-tier nodes per first-tier node, each of which is conductively connectable indirectly to the root node along a respective path via its said first-tier node; and steering means for controlling such connections between the root node and the subsequent-tier nodes so that different packets of charge making up said current signal are steered along different said paths over time.

By arranging nodes in a tree structure (having a root node, first-tier nodes, and subsequent-tier-nodes per first-tier-node, with switches making up the switching means distributed between the nodes along the paths), it may be possible to allow the specifications for the switching performed to become successively more relaxed from tier to subsequent tier. For example, assuming that the paths from the root node to the first-tier nodes are cycled through (for carrying packets) in an order or sequence, and assuming that there are X first tier-nodes, then the rate at which packets pass through a first-tier node is 1/X the rate at which packets pass through the root node. Further, extending this example through the next tier of nodes (part or all of the subsequent tier-nodes), then assuming that there are N second-tier nodes per first-tier node, the rate at which packets pass through a second-tier node is 1/N the rate which packets pass through its first-tier node, and 1/(X·N) the rate at which packets through the root node.

The following are optional features relating to the present aspect, however those features may be provided in combination with features of the other circuitry aspects disclosed herein.

The steering means may be operable to employ sinusoidal control signals to control connections between the root node and the first-tier nodes, and switched-logic control signals to control connections between the first-tier nodes and the subsequent-tier nodes. The control signals used to control connections between the first-tier of nodes and the subsequent-tier of nodes may have larger peak-to-peak voltages and/or longer on-times than that of the control signals used to control connections between the root node and the first-tier of nodes.

Such circuitry may further comprise generating means operable to generate sample values based upon a characteristic of respective such charge packets passing through said subsequent-tier nodes, the sample values being indicative of values of said current signal corresponding to the charge packets concerned.

According to an embodiment of a fifth aspect of the present invention, there is provided current-mode circuitry for sampling a current signal, the circuitry comprising: a first node configured to have the current signal applied thereto; a plurality of second nodes conductively connectable to said first node along respective paths; steering means for controlling such connections between the first node and the second nodes so that different packets of charge making up said current signal are steered along different said paths over time; and reset means connected to a said second node, and operable, during a period between packets for that node, to tend to bring a voltage potential of that node to a predetermined value.

By bringing a voltage potential at a node to a predetermined value, during a period between packets for those nodes, it is possible to reduce errors which may otherwise result from differing amounts of residual charge (for example, from previous charge packets) stored on a parasitic capacitance at that node.

The following are optional features relating to the present aspect, however those features may be provided in combination with features of the other circuitry aspects disclosed herein.

The reset means may be operable to cause the voltage potential of that second node to return to the same value between successive packets for that node. The circuitry may comprise a plurality of such reset means each for a different such second node. There may be provided such a reset means per second node.

According to an embodiment of a sixth aspect of the present invention, there is provided current-mode circuitry for sampling first and second complementary current signals, the circuitry comprising: first and second complementary circuitry portions, the first portion for sampling the first current signal and the second portion for sampling the second current signal, wherein each said portion comprises: a first node configured to have the current signal for that portion applied thereto; a plurality of second nodes conductively connectable to the first node of that portion along respective paths; and steering means for controlling such connections between the first node and the second nodes of that portion so that different packets of charge making up the current signal of that portion are steered along different said paths of that portion over time; and reset means connected to at least one of a said second node of the first portion and the complementary node of the second portion, and operable, during a period between packets for that pair of complementary nodes, to tend to bring a difference in voltage potential between those two nodes to a predetermined value.

By bringing a difference in voltage potential between pairs of complementary nodes to a predetermined value, during a period between packets for those nodes, it is possible to reduce errors which may otherwise result from differing amounts of residual charge (for example, from previous charge packets) stored on parasitic capacitances of those nodes.

The following are optional features relating to the present aspect, however those features may be provided in combination with features of the other circuitry aspects disclosed herein.

The reset means may be connected to both nodes of the pair of complementary nodes. The reset means may be operable to connect the or both of the nodes of the pair of complementary nodes to a reference potential so as to tend to bring the difference in potential to a predetermined value. The reset means may be operable to bring the nodes of the pair of complementary nodes to the same potential as one another. The reset means may be connected between the pair of complementary nodes, and may be operable to connect those nodes together so as to bring those nodes to the same potential as one another. The reset means may be operable to cause a voltage potential of the or both of the nodes of the pair of complementary nodes to return to the same value between successive packets. There may be provided plurality of such reset means each for a different such pair of complementary nodes. There may be provided such a reset means per such pair of complementary nodes.

In such circuitry, each said portion may comprises generating means for generating sample values based upon a characteristic of respective such charge packets passing through the second nodes of that portion, the sample values being indicative of values of the current signal of that portion corresponding to the charge packets concerned.

According to an embodiment of a seventh aspect of the present invention, there is provided current-mode circuitry for sampling first and second complementary current signals, the circuitry comprising: first and second complementary circuitry portions, the first portion for sampling the first current signal and the second portion for sampling the second current signal, wherein each said portion comprises: a root node configured to have the current signal for that portion applied thereto; a plurality of first-tier nodes each of which is conductively connectable directly to the root node of that portion; a plurality of subsequent-tier nodes per first-tier node of that portion, each of which is conductively connectable indirectly to the root node of that portion along a respective path via its said first-tier node; and steering means for controlling such connections between the root node and the subsequent-tier nodes of that portion so that different packets of charge making up the current signal of that portion are steered along different said paths of that portion over time; and reset means connected to at least one of a said first or subsequent-tier node of the first portion and the complementary node of the second portion, and operable, during a period between packets for that pair of complementary nodes, to tend to bring a difference in voltage potential between those two nodes to a predetermined value.

By bringing a difference in voltage potential between pairs of complementary nodes to a predetermined value, during a period between packets for those nodes, it is possible to reduce errors which may otherwise result from differing amounts of residual charge (for example, from previous charge packets) stored on parasitic capacitances of those nodes.

The following are optional features relating to the present aspect, however those features may be provided in combination with features of the other circuitry aspects disclosed herein.

The reset means may be connected to both nodes of the pair of complementary nodes. The reset means may be operable to connect the or both of the nodes of the pair of complementary nodes to a reference potential so as to tend to bring the difference in potential to a predetermined value. The reset means may be operable to bring the nodes of the pair of complementary nodes to the same potential as one another. The reset means may be connected between said pair of complementary nodes, and may be operable to connect those nodes together so as to bring those nodes to the same potential as one another. The reset means may be operable to cause a voltage potential of the or both of the nodes of the pair of complementary nodes to return to the same value between successive packets. There may be provided a plurality of such reset means each for a different such pair of complementary nodes. There may be provided such a reset means per such pair of complementary nodes.

In such circuitry, each said portion may comprise: generating means for generating sample values based upon a characteristic of respective such charge packets passing through the subsequent-tier nodes of that portion, the sample values being indicative of values of the current signal of that portion corresponding to the charge packets concerned.

According to an embodiment of an eighth aspect of the present invention, there is provided analogue-to-digital conversion circuitry, comprising circuitry according to any of the aforementioned aspects of the present invention. According to an embodiment of a ninth aspect of the present invention, there is provided integrated circuitry, comprising circuitry according to any of the aforementioned aspects of the present invention. According to an embodiment of a tenth aspect of the present invention, there is provided an IC chip, comprising circuitry according to any of the aforementioned aspects of the present invention.

According to an embodiment of an eleventh aspect of the present invention, there is provided a method of sampling a current signal in current-mode circuitry, the circuitry having a first node configured to have the current signal applied thereto and X second nodes conductively connectable to said first node along respective paths, the method comprising:

controlling such connections between the first node and the second nodes in dependence upon X time-interleaved sinusoidal control signals so that different packets of charge making up said current signal are steered along different said paths over time, wherein: X is an integer greater than or equal to 3.

According to an embodiment of a twelfth aspect of the present invention, there is provided a method of sampling a current signal in current-mode circuitry, the circuitry having a first node configured to have the current signal applied thereto and a plurality of second nodes conductively connectable to said first node along respective paths, the method comprising: controlling such connections between the first node and the second nodes so that different packets of charge making up said current signal are steered along different said paths over time; generating sample values based upon a characteristic of respective such charge packets passing through said second nodes, the sample values being indicative of values of said current signal corresponding to the charge packets concerned; combining sample values from one or more of said second nodes to provide one or more combined sample values; and calibrating operation of the circuitry in dependence upon said combined sample value(s).

According to an embodiment of a thirteenth aspect of the present invention, there is provided a method of sampling a current signal in current-mode circuitry, the circuitry having a first node configured to have the current signal applied thereto and a plurality of second nodes conductively connectable to said first node along respective paths, the method comprising: generating substantially sinusoidal control signals; controlling such connections between the first node and the second nodes in dependence upon the sinusoidal control signals so that different packets of charge making up said current signal are steered along different said paths over time; generating sample values based upon a characteristic of respective such charge packets passing through said second nodes, the sample values being indicative of values of said current signal corresponding to the charge packets concerned; analysing the or some of the sample values; and calibrating operation of the circuitry in dependence upon such analysis.

According to an embodiment of a fourteenth aspect of the present invention, there is provided a method of sampling a current signal in current-mode circuitry, the circuitry having a root node configured to have the current signal applied thereto, a plurality of first-tier nodes each of which is conductively connectable directly to the root node, and a plurality of subsequent-tier nodes per first-tier node, each of which is conductively connectable indirectly to the root node along a respective path via its said first-tier node, the method comprising: controlling such connections between the root node and the subsequent-tier nodes so that different packets of charge making up said current signal are steered along different said paths over time.

According to an embodiment of a fifteenth aspect of the present invention, there is provided a method of sampling first and second complementary current signals in current-mode circuitry, the circuitry having first and second complementary circuitry portions, the first portion for sampling the first current signal and the second portion for sampling the second current signal, wherein each said portion comprises a first node configured to have the current signal for that portion applied thereto and a plurality of second nodes conductively connectable to the first node of that portion along respective paths, the method comprising: for each said portion, controlling such connections between the first node and the second nodes of that portion so that different packets of charge making up the current signal of that portion are steered along different said paths of that portion over time; and for at least one of a said second node of the first portion and the complementary node of the second portion, and during a period between packets for that pair of complementary nodes, tending to bring a difference in voltage potential between those two nodes to a predetermined value.

According to an embodiment of a sixteenth aspect of the present invention, there is provided a method of sampling first and second complementary current signals in current-mode circuitry, the circuitry having first and second complementary circuitry portions, the first portion for sampling the first current signal and the second portion for sampling the second current signal, wherein each said portion comprises a root node configured to have the current signal for that portion applied thereto, a plurality of first-tier nodes each of which is conductively connectable directly to the root node of that portion, and a plurality of subsequent-tier nodes per first-tier node of that portion, each of which is conductively connectable indirectly to the root node of that portion along a respective path via its said first-tier node, the method comprising: for each said portion, controlling such connections between the root node and the subsequent-tier nodes of that portion so that different packets of charge making up the current signal of that portion are steered along different said paths of that portion over time; and for at least one of a said first or subsequent-tier node of the first portion and the complementary node of the second portion, and during a period between packets for that pair of complementary nodes, tending to bring a difference in voltage potential between those two nodes to a predetermined value.

According to an embodiment of a seventeenth aspect of the present invention, there is provided a method of sampling a current signal in current-mode circuitry, the circuitry having a first node configured to have the current signal applied thereto and a plurality of second nodes conductively connectable to said first node along respective paths, the method comprising: controlling such connections between the first node and the second nodes so that different packets of charge making up said current signal are steered along different said paths over time; and for a said second node, and during a period between packets for that node, tending to bring a voltage potential of that node to a predetermined value.

Features of apparatus (circuitry) aspects apply equally to method aspects, and vice versa. Features of one circuitry aspect, such as those features specified as optional features, may be provided in combination with features of the other circuitry aspects.

The present invention extends to IC chips as mentioned above, circuit boards comprising such IC chips, and communication networks (for example, internet fiber-optic networks and wireless networks) and network equipment of such networks, comprising such circuit boards.

Reference will now be made, by way of example, to the accompanying drawings, of which:—

FIG. 1, discussed above, is a schematic diagram of a known time-interleaved ADC;

FIG. 2, discussed above, is a schematic diagram of another known time-interleaved ADC;

FIG. 3, discussed above, is a schematic diagram of T/H circuitry;

FIG. 4, discussed above, is an enlarged diagram of a clock signal, for appreciating the effect of slew rate;

FIG. 5, discussed above, is a diagram useful for understanding the effect of slew-rate-related and input-dependent timing errors;

FIG. 6, discussed above, is a frequency-response diagram indicating the effects of gain mismatch G and roll-off mismatch R;

FIG. 7, discussed above, presents an ideal FFT trace in its upper half and an example frequency spectrum of an input signal in its lower half;

Figure 9:
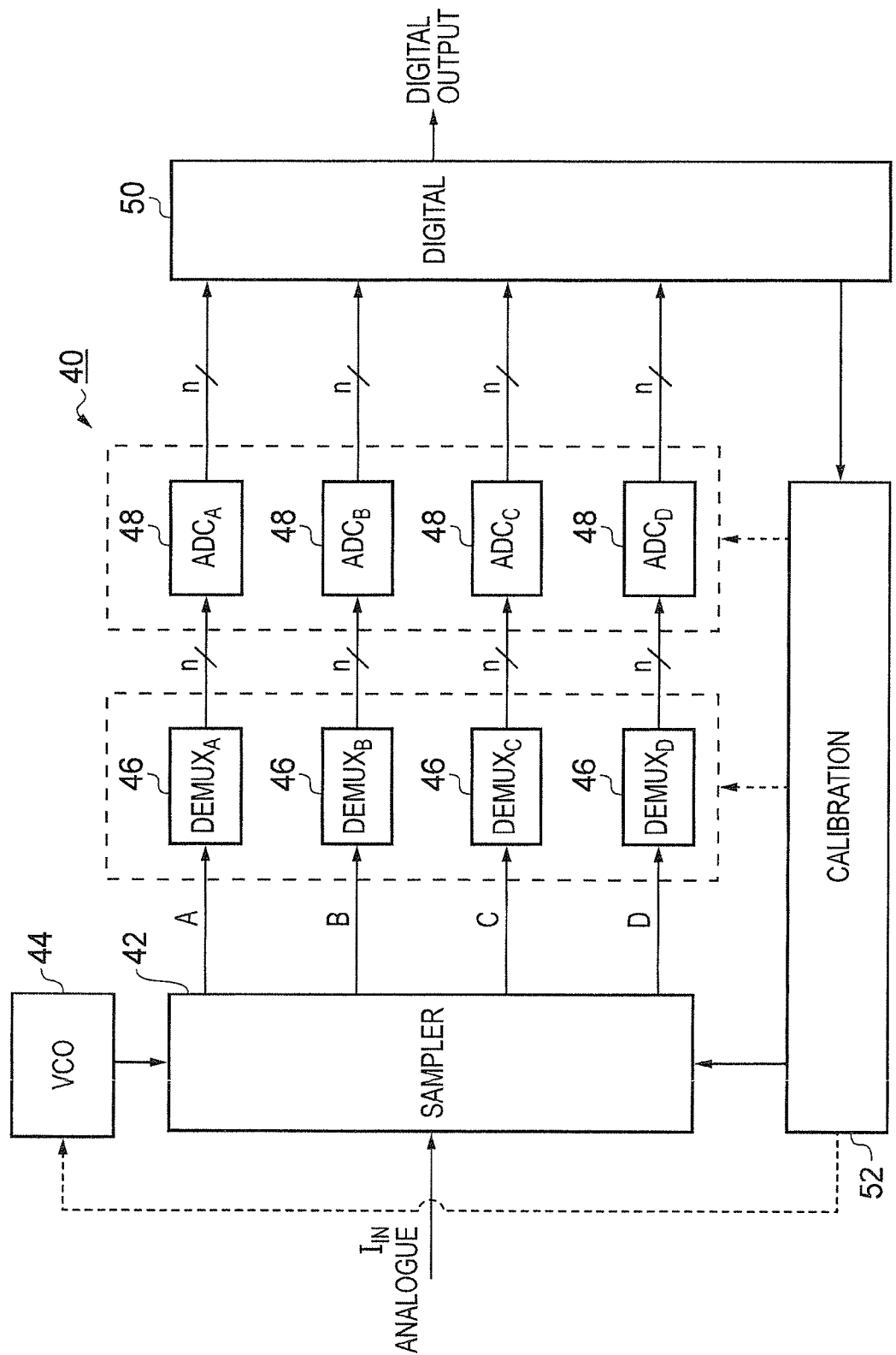
FIG. 9 is a schematic diagram of analogue-to-digital circuitry embodying the present invention.
Figure 12:
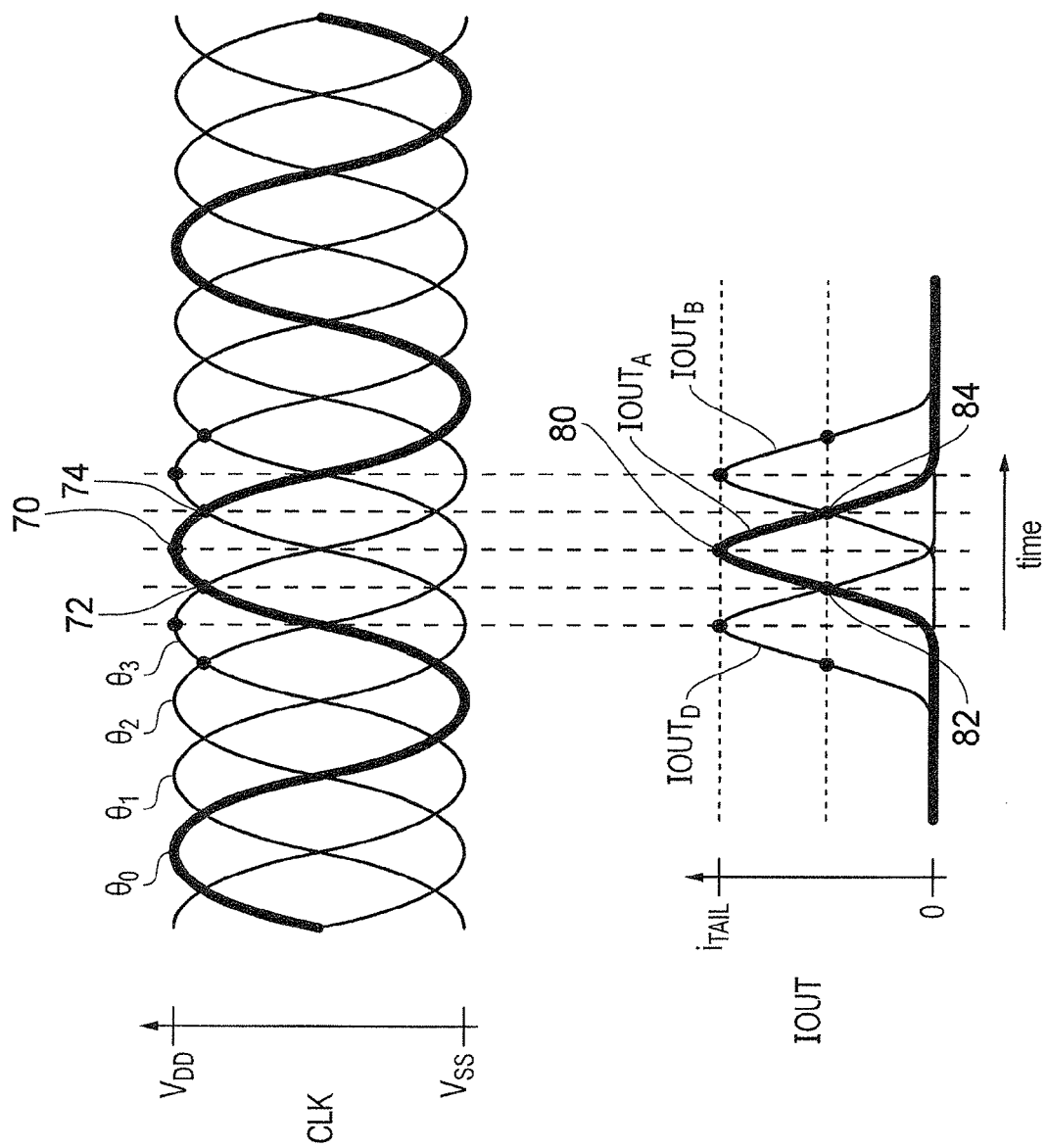
FIG. 12 shows waveforms of clock signals $\theta_0$ to $\theta_3$ and partial waveforms of currents $IOUT_A$, $IOUT_B$ and $IOUT_D$.
Figure 13:
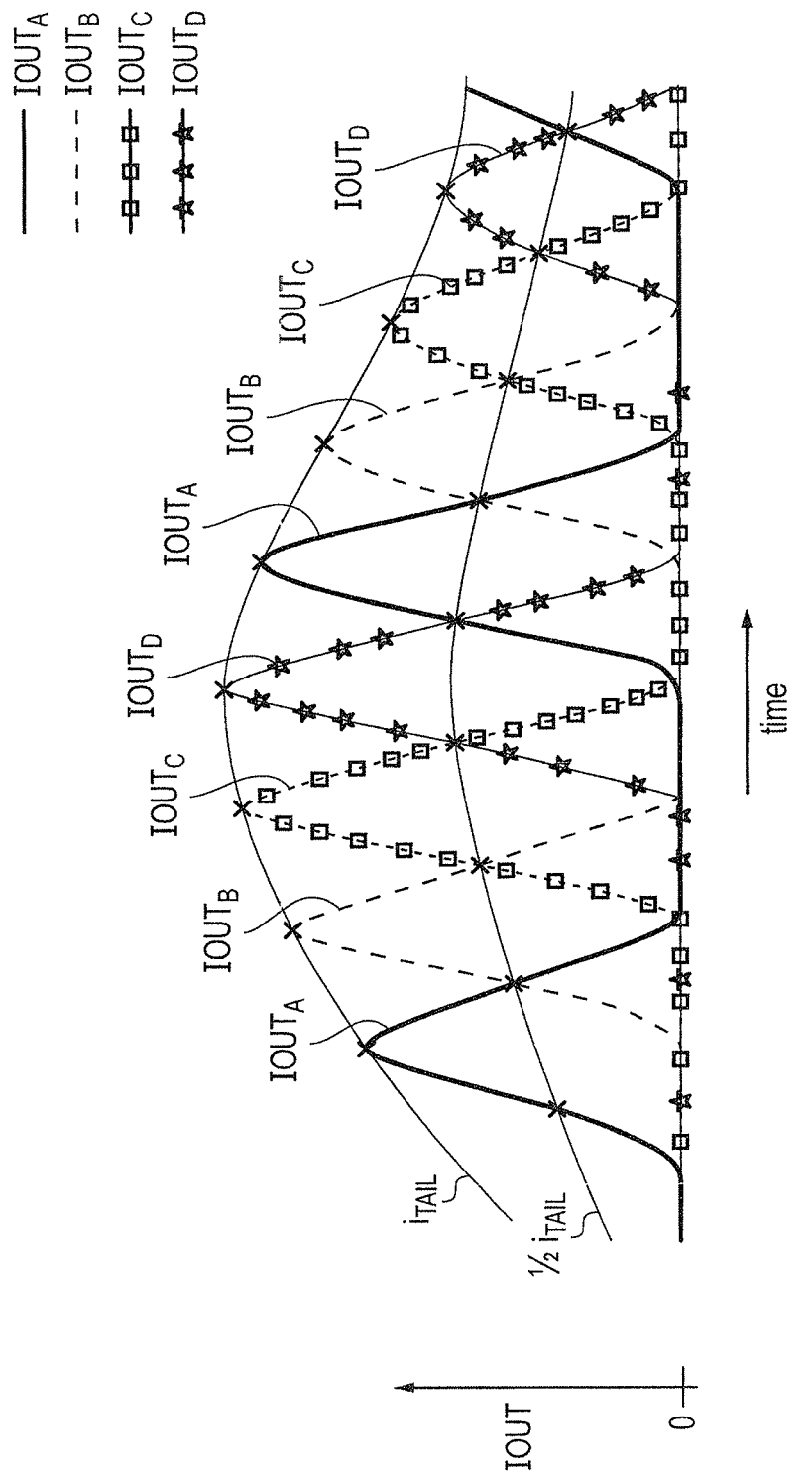
FIG. 13 shows waveforms for $IOUT_A$ to $IOUT_D$ as $I_{TAIL}$ increases and decreases.
Figure 14:
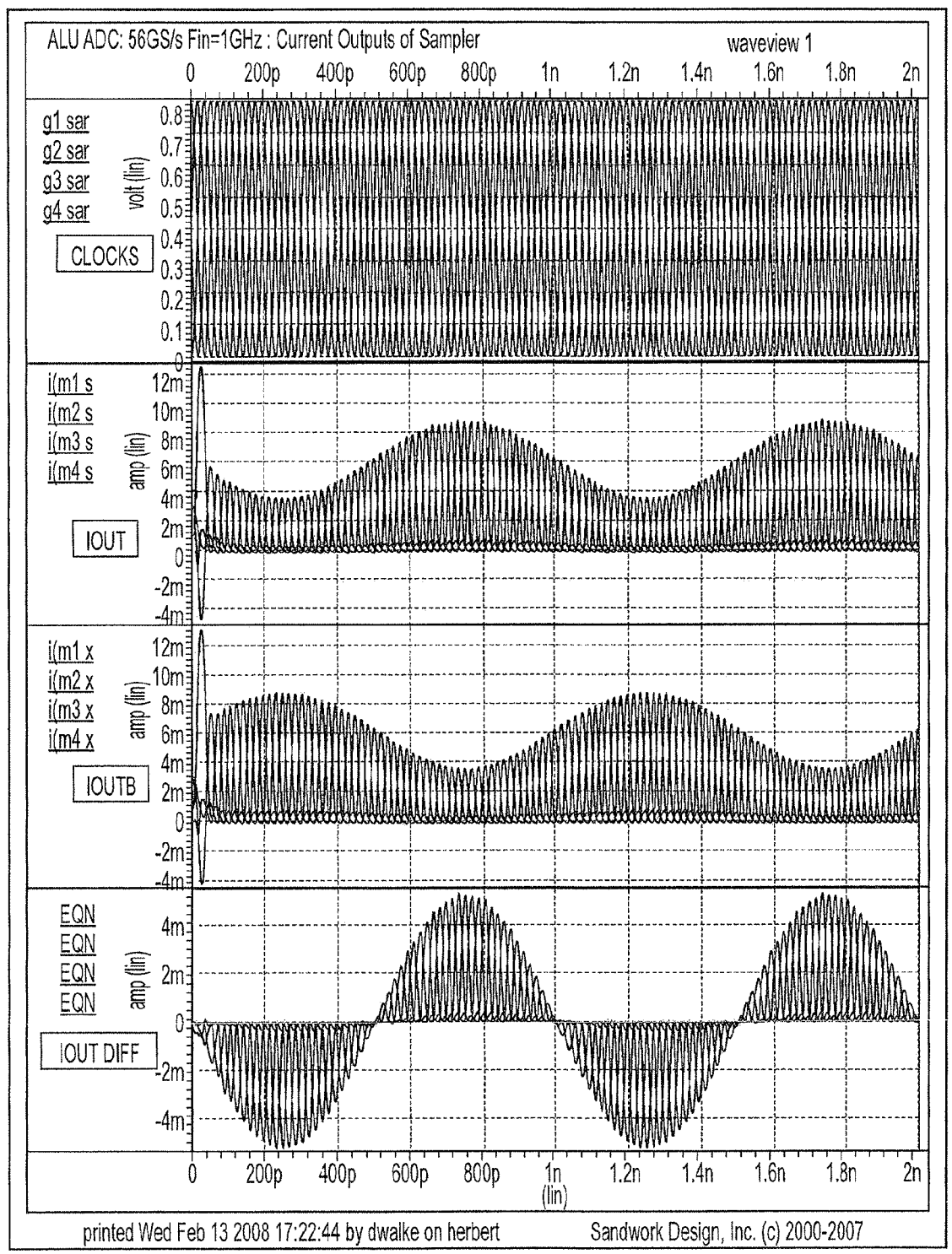
Figure 15:
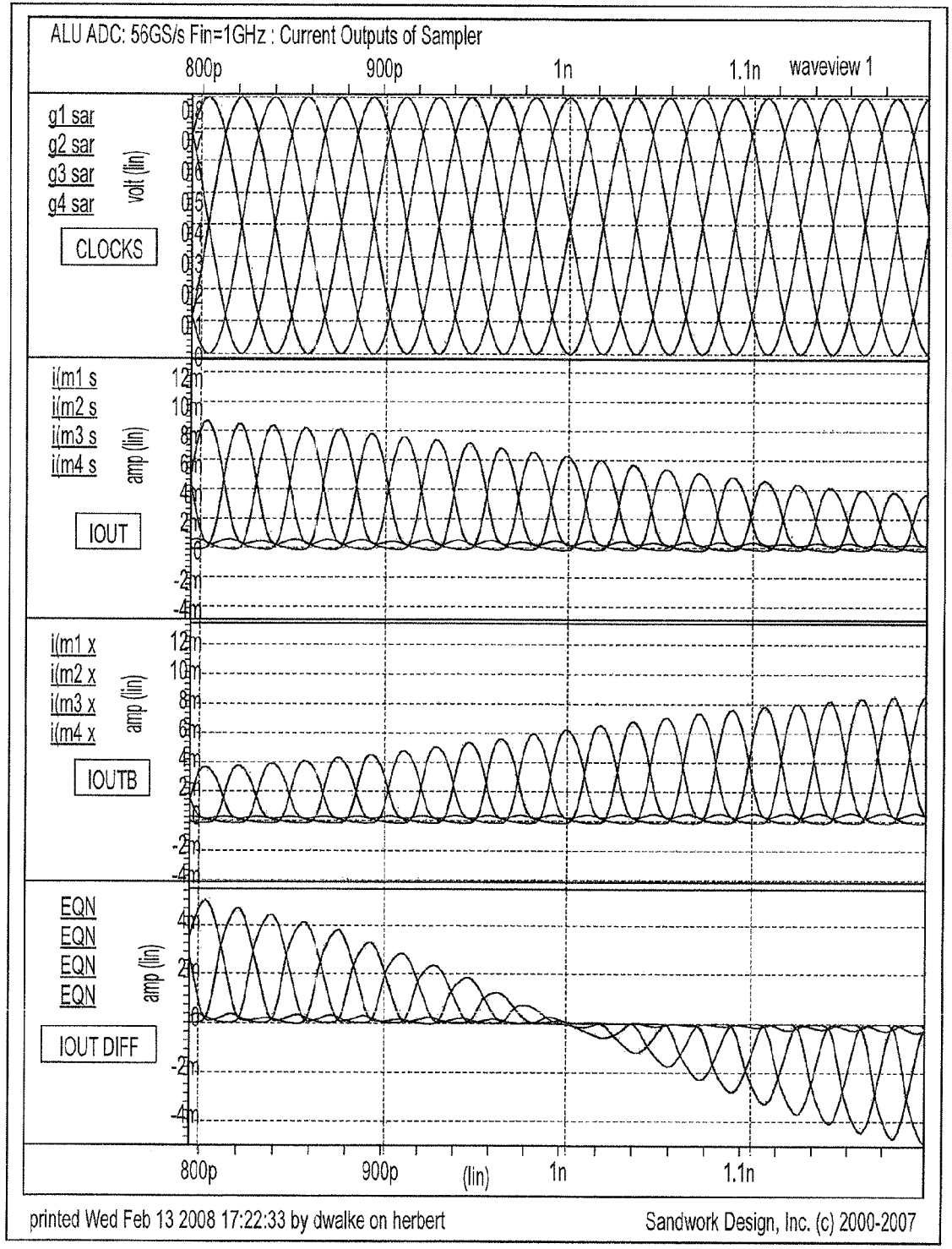
Figure 16:
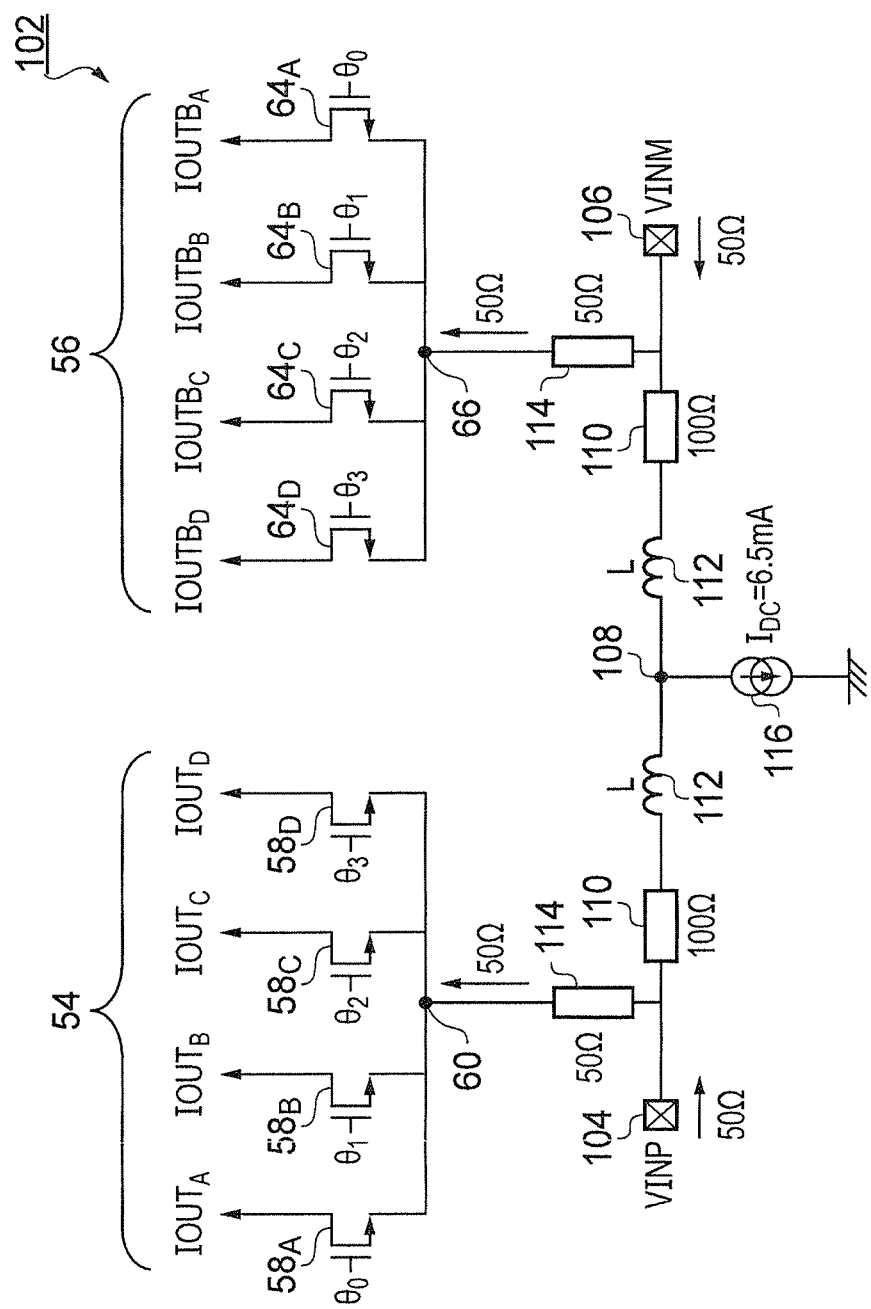
Figure 17:
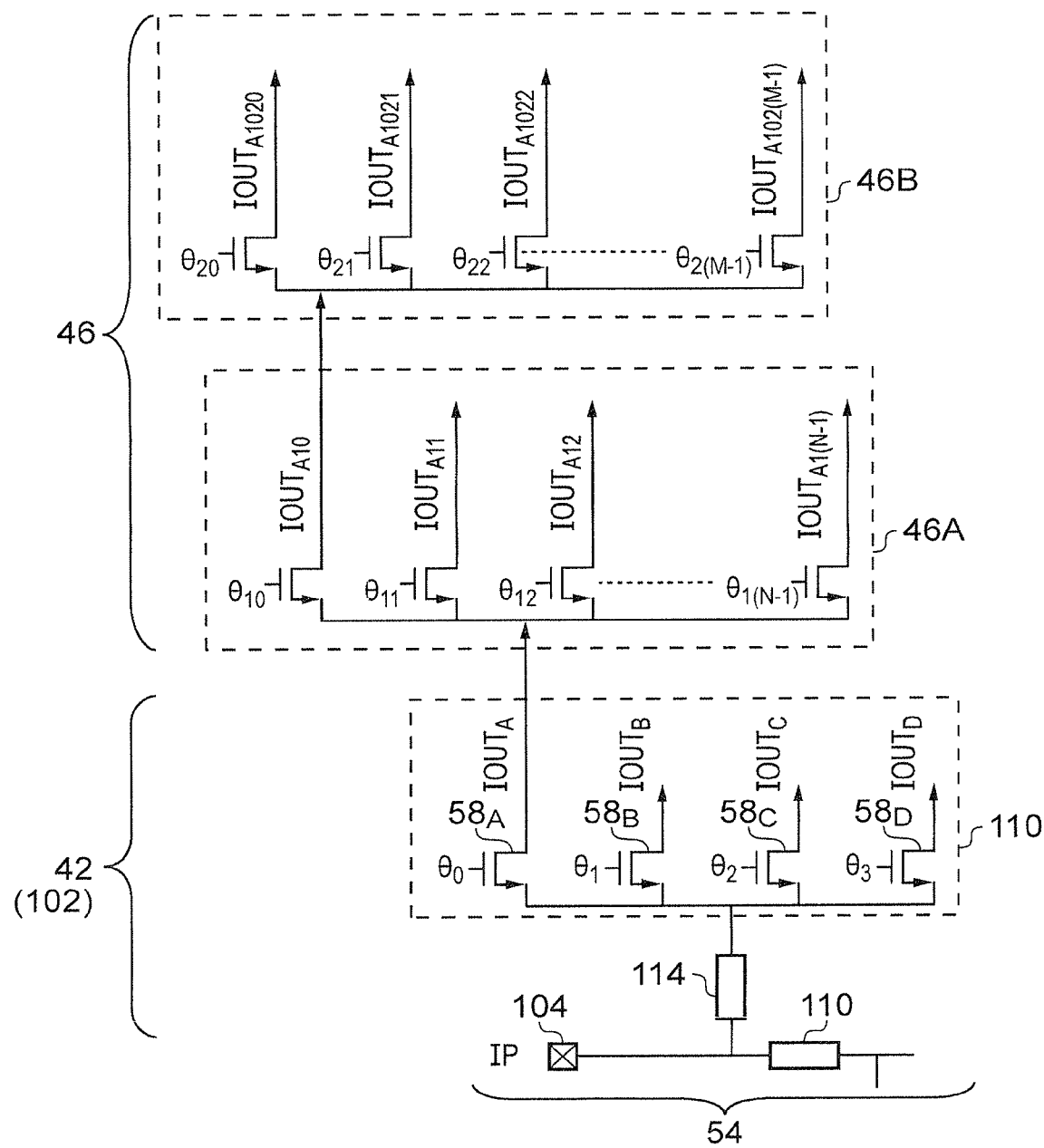
Figure 18:
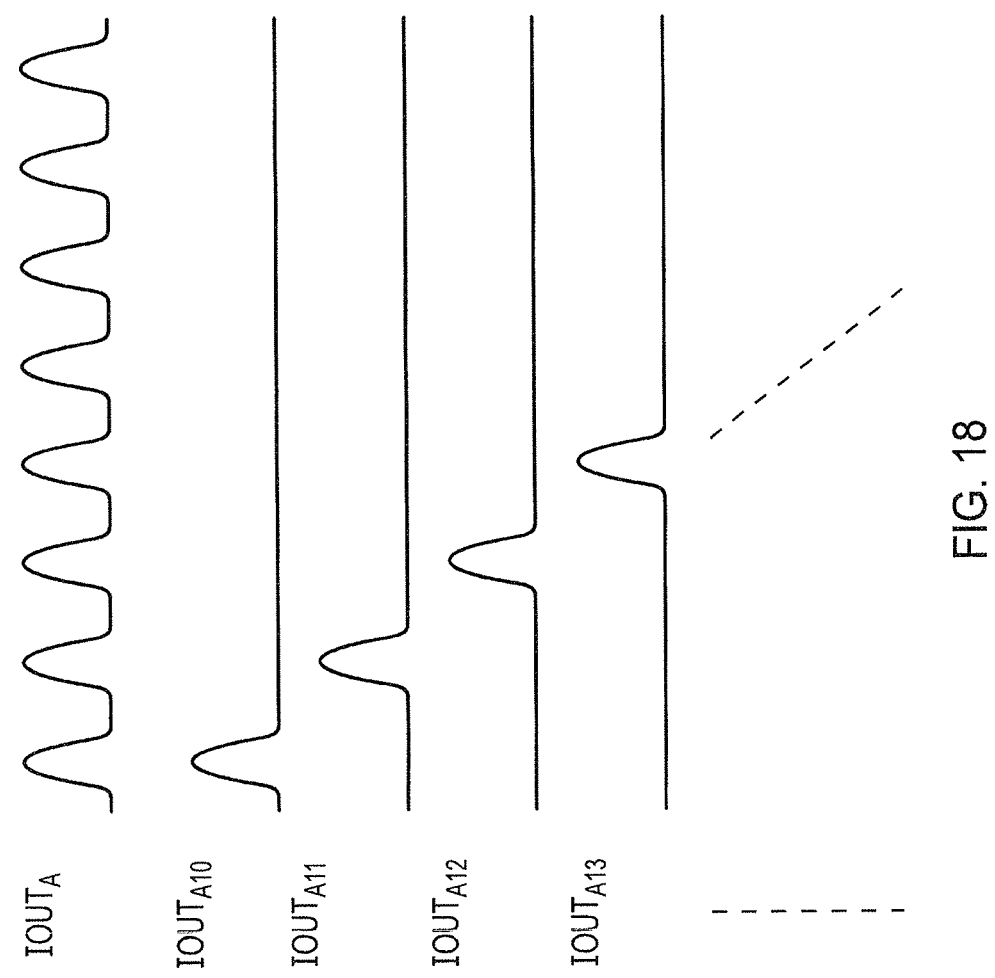
Figure 19:
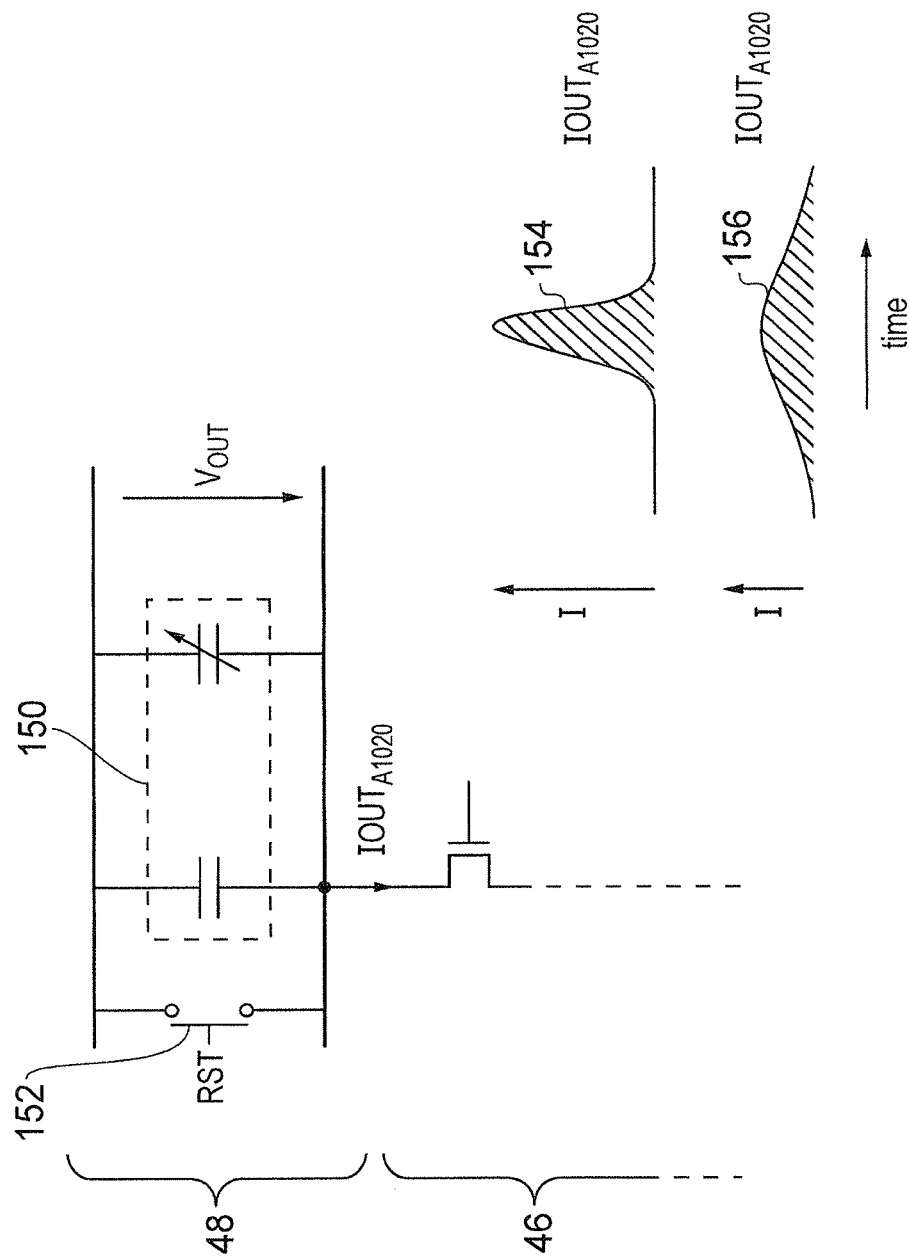
Figure 20:
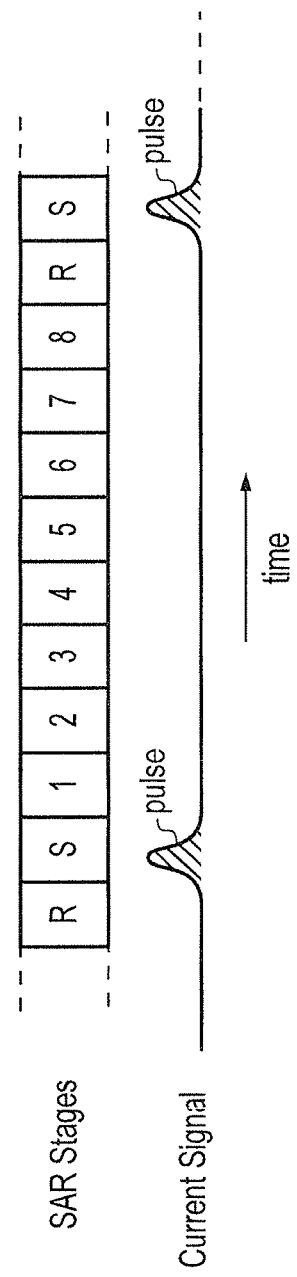
Figure 21:
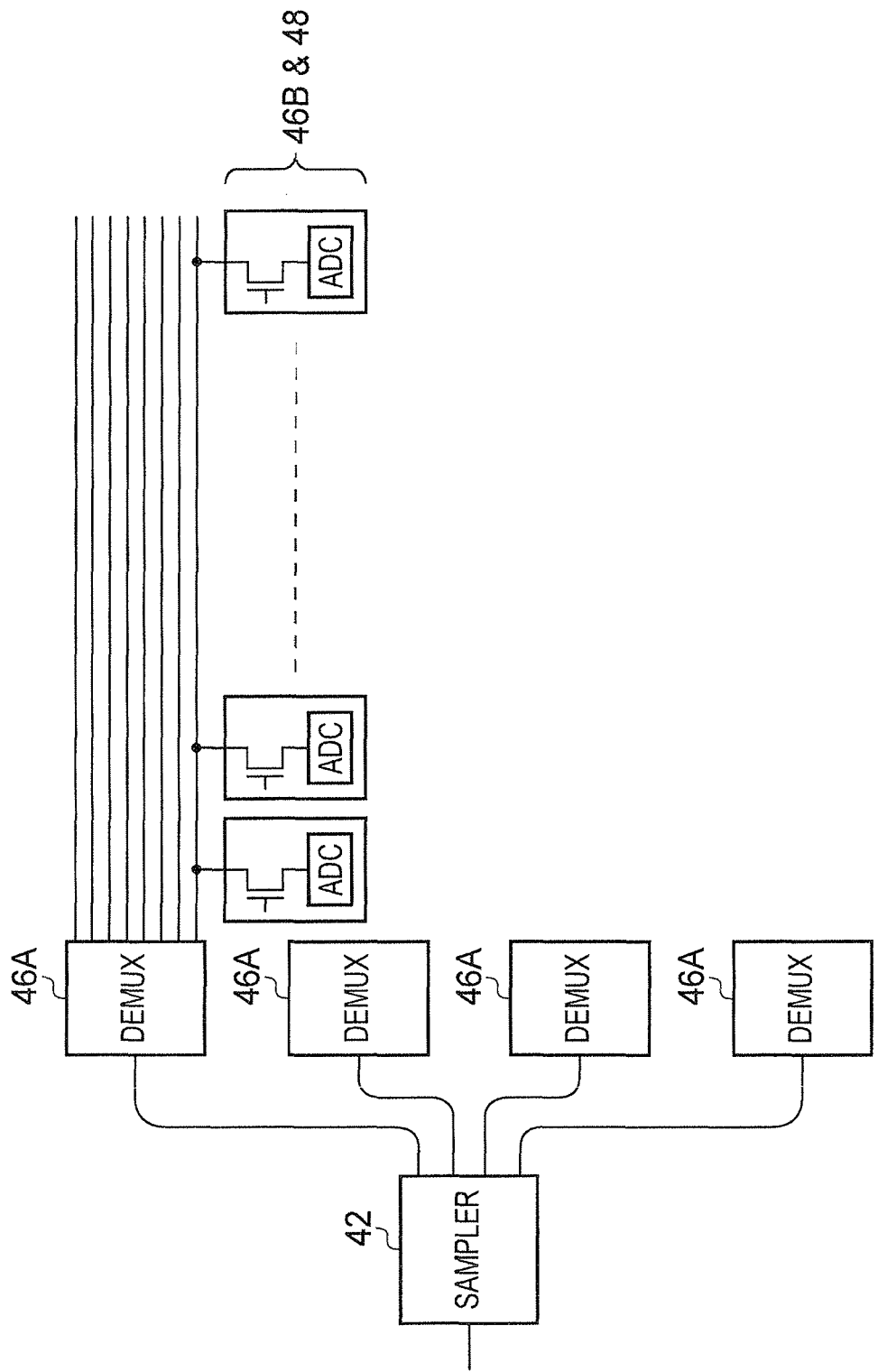
Figure 22:
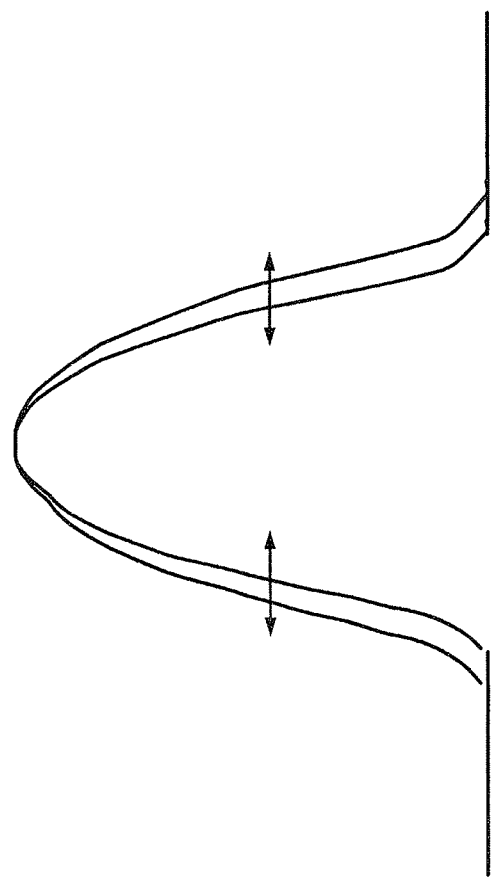
Figure 23:
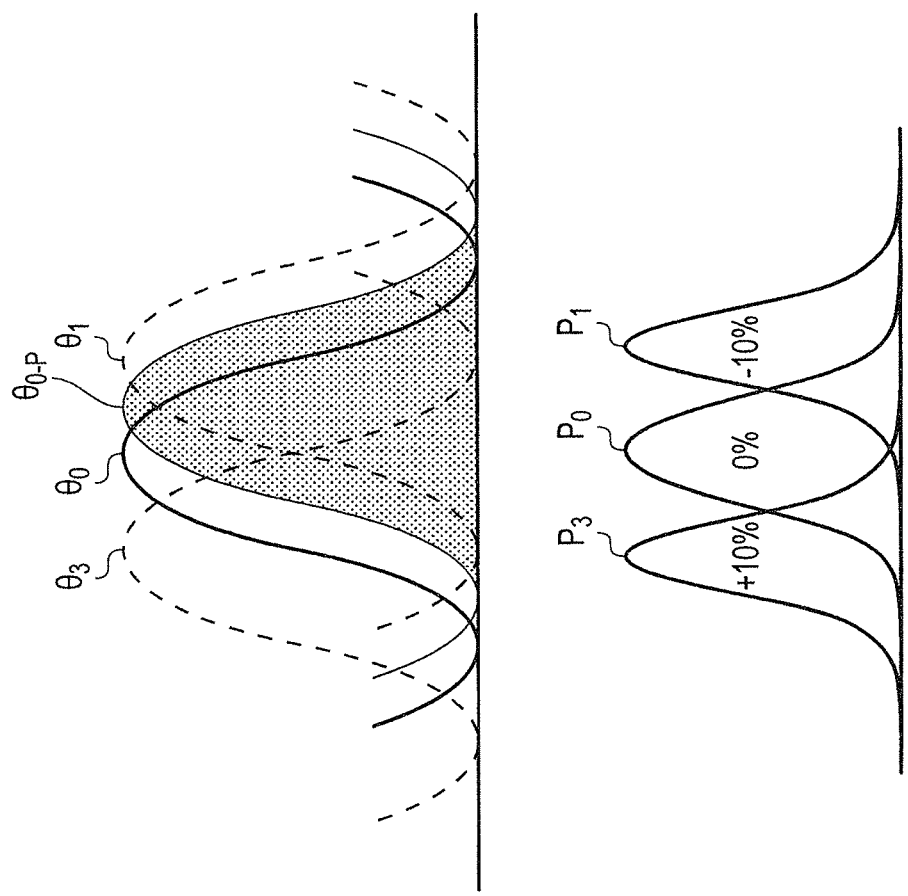
Figure 24:
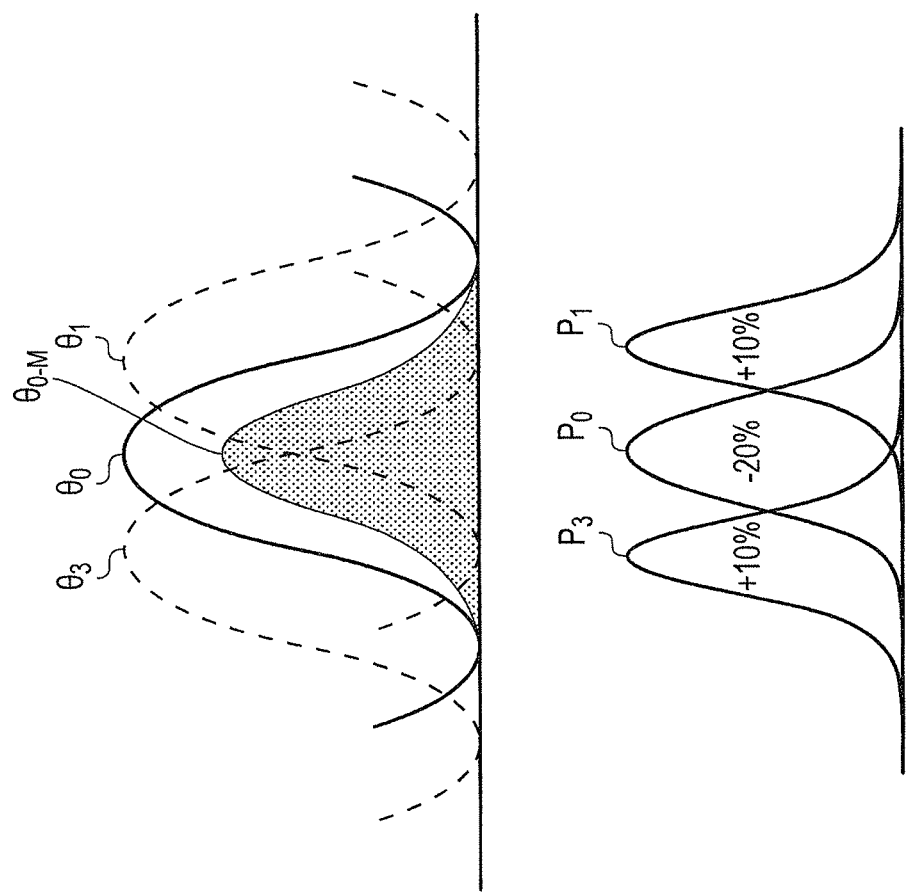
Figure 25:
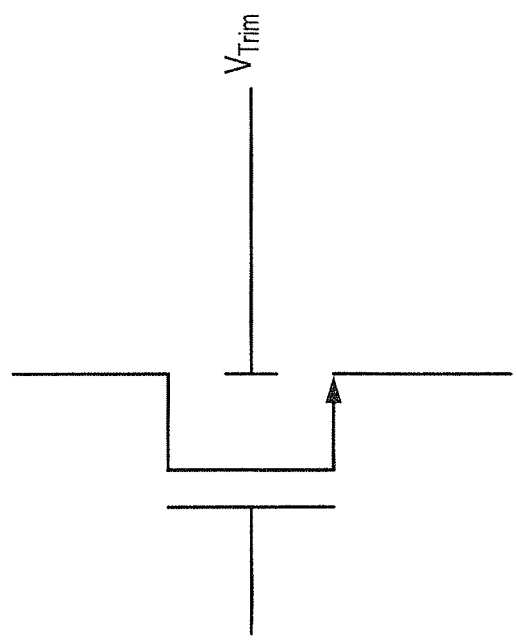
Figure 26:
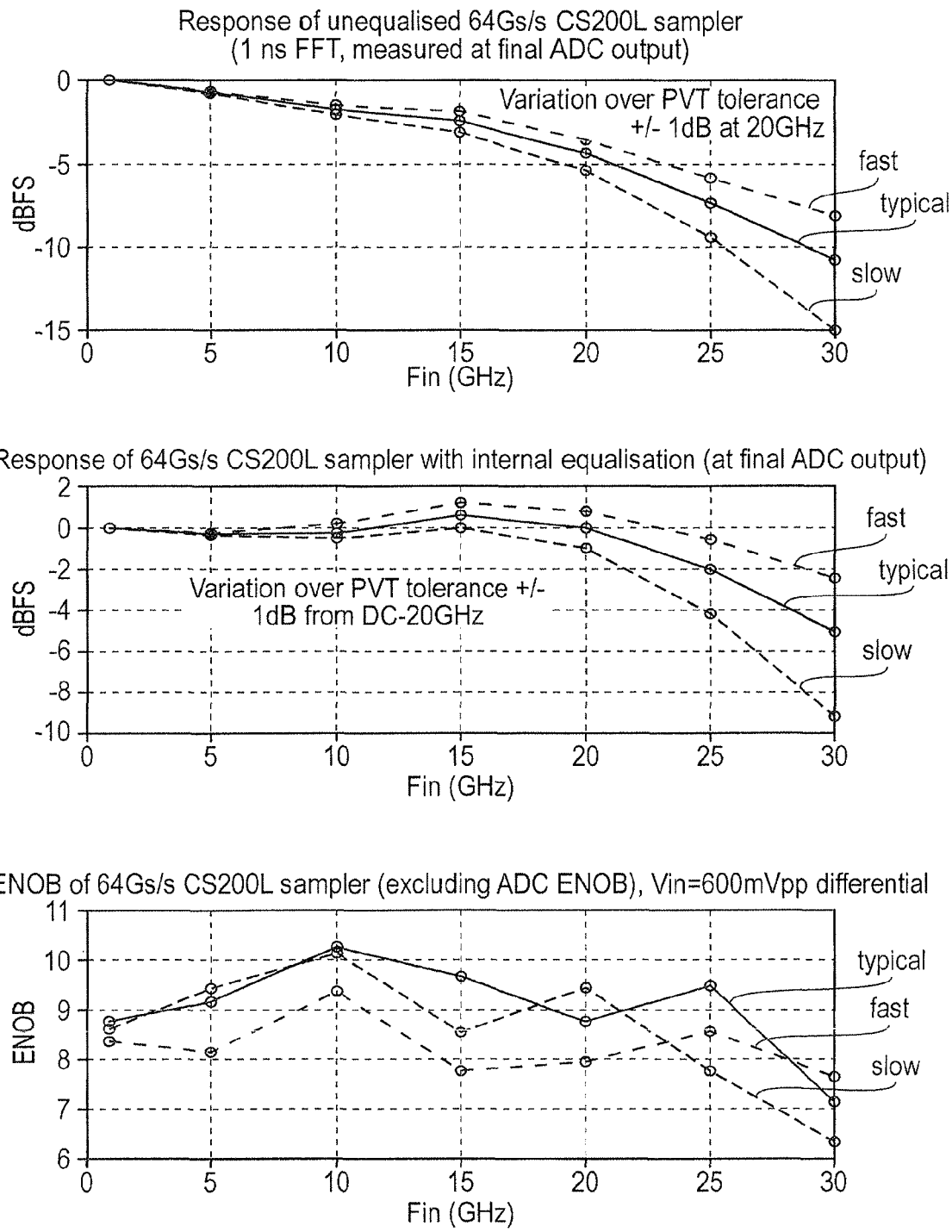
Figure 27:
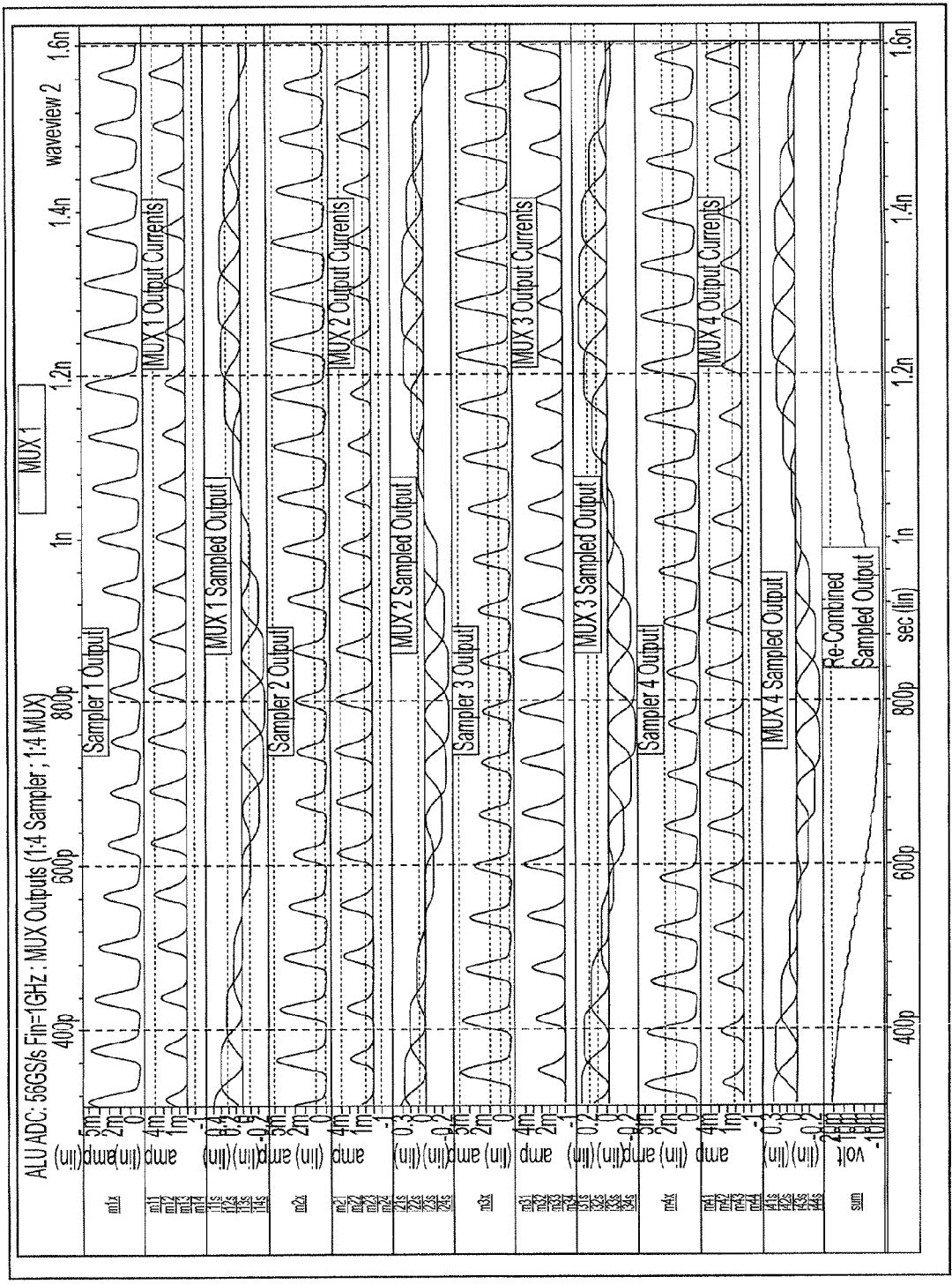
Figure 28:
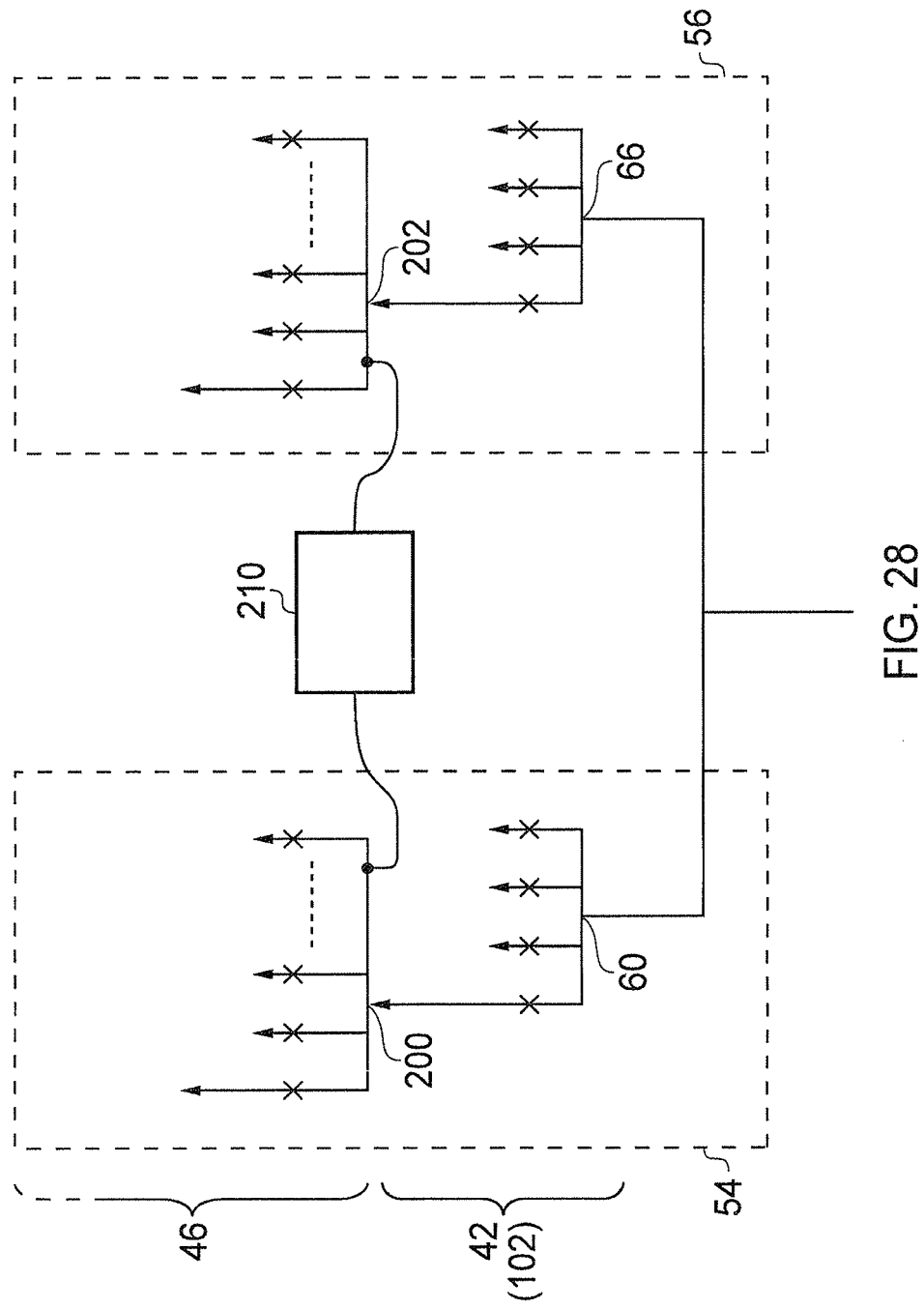

FIGS. 14 and 15 present simulation results to demonstrate operation of an embodiment of the present invention;

FIG. 16 is a schematic diagram of an example implementation of sampling circuitry embodying the present invention;

FIG. 17 is a schematic diagram of parts of the FIG. 9 ADC circuitry;

FIG. 18 is a schematic diagram useful for understanding operation of the demultiplexers in FIG. 17;

FIG. 19 is a schematic diagram useful for understanding the principle of operation of the FIG. 9 ADC banks;

FIG. 20 is a schematic diagram useful for understanding a possible application of SAR circuitry in embodiments of the present invention;

FIG. 21 is a schematic diagram useful for understanding a possible layout of the FIG. 9 ADC circuitry;

FIG. 22 is a schematic diagram useful for understanding the concept of calibration techniques employed in embodiments of the present invention;

FIG. 23 is a partial duplication of the waveforms in FIG. 12, with additional signals representing a VCO timing error;

FIG. 24 is a partial duplication of the waveforms in FIG. 12, with additional signals representing a threshold voltage error in one of the sampling switches;

FIG. 25 is a schematic diagram of a sampler switch, to show how a trim voltage may be applied to its body terminal;

FIGS. 26 and 27 present simulation results for a full implementation of the FIG. 9 ADC circuitry; and FIG. 28 is a schematic diagram of parts of the FIG. 9 ADC circuitry, useful for appreciating a possible refinement.

Before describing detailed embodiments of the present invention, the general concept of embodiments of the present invention will first be explored.

Much of the previously-considered ADC architectures, as described with reference to FIGS. 1 to 7 above, carry out sampling and demultiplexing based upon voltages, i.e. in the voltage domain. That is, in such architectures, any information content stored in the signals is represented by the voltage level of those signals. In the operation of such circuitry, voltage is the independent variable and current is dependent on the voltage. Put another way, voltage is the cause and current is the effect. Such ADC circuitry is thus considered voltage-mode circuitry. In contrast, embodiments of the present invention carry out sampling and demultiplexing based upon currents, i.e. in the current domain. That is, in embodiments of the present invention, any information content stored in the signals is represented by the current level of those signals. In the operation of such circuitry, current is the independent variable and voltage is dependent on the current; current is the cause and voltage is the effect. ADC circuitry embodying the present invention may thus be considered to be current-mode circuitry, although it may of course be incorporated into, or employed in conjunction with, voltage-mode circuitry. Circuitry embodying the present invention may be provided as part or all of integrated circuitry, for example as an IC chip. The present invention may also extend to circuit boards comprising such IC chips.

In general terms, an embodiment of the present invention takes a current as the input signal (i.e. a signal whose current magnitude carries information content), and splits that current into n time-interleaved pulse streams, each at 1/n the overall sampling rate, using an n-phase sinewave clock. As information content in embodiments of the present invention is represented by the size of the pulses or packets, the size of a pulse being measured as an amount of charge since $Q=\int Idt$, such circuitry may be considered "charge-mode" circuitry, and the phrase "current-mode" is to be interpreted accordingly. It is true that current-mode sampling is known per se, however it will become apparent that considerable benefits over-and-above such known sampling techniques result from embodiments of the present invention disclosed herein.

Figure 8:
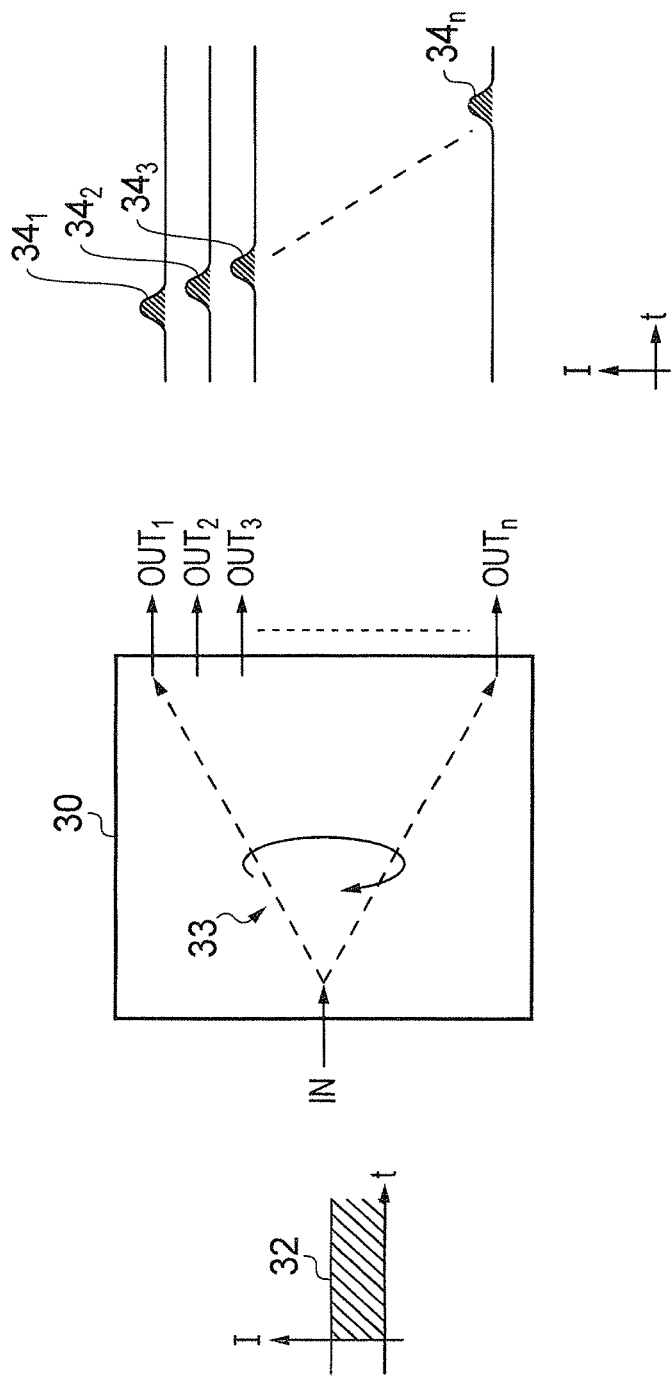
FIG. 8 is a schematic diagram of current-mode sampling circuitry.

FIG. 8 is a schematic diagram of sampling circuitry 30. Circuitry 30 has an input node IN and a plurality of associated output nodes $OUT_1$ to $OUT_n$.

The input node is adapted to receive an input signal as a current 32, the magnitude of the current 32 representing the information carried by the input signal. Accordingly, although the magnitude of the current 32 is steady in FIG. 8 for simplicity, it will be understood that the magnitude could fluctuate, for example to carry a data signal.

The circuitry 30 comprises routing (or steering) means 33 for routing the received current 32 to different said output nodes ($OUT_1$ to $OUT_n$) over time. In the present case, routing means 33 is operable to route the current 32 to different output nodes $OUT_1$ to $OUT_n$ in a step-wise ordered fashion and in synchronization with a clock signal (not shown). For example, the routing means 33 is operable to connect the input node IN to output node $OUT_1$ and then to output node $OUT_2$, and so on and so forth through to output node $OUT_n$, before returning to output node $OUT_1$. In this way, the routing means 33 cycles through the output nodes such that the current 32 is effectively divided up on a time-wise basis into samples (or parts) $34_1$ to $34_n$ received at the output nodes $OUT_1$ to $OUT_n$ respectively.

The routing means 33 may change its connection from one output node to the next such that no two output nodes are ever connected to the input node at the same time. Alternatively, as is true of embodiments of the present invention disclosed herein, the routing means 33 may gradually change its connection from one output node to the next such that there are periods of time when more than one output node is connected to the input node.

Circuitry 30 may further comprise generating means (not shown) for generating output values based upon the samples or pulses $34_1$ to $34_n$ received at the output nodes $OUT_1$ to $OUT_N$, the output values being indicative of input values of parts of the input signal (current 32) corresponding to said current samples $34_1$ to $34_n$. The circuitry 30 may thus be configured to perform analogue-to-digital conversion, for example if the generating means is operable to output digital output values.

FIG. 9 is a schematic diagram of analogue-to-digital circuitry 40 embodying the present invention. Circuitry 40 comprises sampler 42, voltage-controlled oscillator (VCO) 44, demultiplexers 46, ADC banks 48, digital unit 50 and calibration unit 52.

The sampler 42 is configured to perform four-way or four-phase time-interleaving so as to split the input current $I_{IN}$ into four time-interleaved sample streams A to D. For this purpose, VCO 44 is a quadrature VCO operable to output four clock signals 90° out of phase with one another, for example as four raised cosine signals. VCO 44 may for example be a shared 14 GHz quadrature VCO to enable circuitry 40 to have an overall sample rate of 56 GS/s.

Each of streams A to D comprises a demultiplexer 46 and an ADC bank 48 connected together in series as shown in FIG. 9. The sampler operates in the current mode as in previous embodiments, and, accordingly, streams A to D are effectively four time-interleaved streams of current pulses originating from (and together making up) input current $I_{IN}$, each stream having a sample rate one quarter of the overall sample rate.

Continuing the example overall sample rate of 56 GS/s, each of the streams A to D may have a 14 GS/s sample rate.

Focusing on stream A by way of example, the stream of current pulses is first demultiplexed by an n-way demultiplexer 46. Demultiplexer 46 is a current-steering demultiplexer and this performs a similar function to sampler 42, splitting stream A into n time-interleaved streams each having a sample rate equal to ¼n of the overall sample rate. Continuing the example overall sample rate of 56 GS/s, the n output streams from demultiplexer 46 may each have a 14/n GS/s sample rate. If n were to be 80 or 160 for example, the output streams of demultiplexer 46 may have a 175 MS/s or 87.5 MS/s sample rate, respectively. Demultiplexer 46 may perform the 1:n demultiplexing in a single stage, or in a series of stages. For example, in the case of n=80, demultiplexer 46 may perform the 1:n demultiplexing by means of a first 1:8 stage followed by a second 1:10 stage.

The n streams output from demultiplexer 46 pass into ADC bank 48, which contains n ADC sub-units each operable to convert its incoming pulse stream into digital signals, for example into 8-bit digital values. Accordingly, n digital streams pass from ADC bank 48 to digital unit 50. In the case of n=80, the conversion rate for the ADC sub-units may be 320 times slower than the overall sample rate.

Streams B, C, and D operate analogously to stream A, and accordingly duplicate description is omitted. In the above case of n=80, circuitry 40 may be considered to comprise 320 ADC sub-units split between the four ADC banks 48.

The four sets of n digital streams are thus input to the digital unit 50 which multiplexes those streams to produce a single digital output signal representative of the analogue input signal, current $I_{IN}$. This notion of producing a single digital output may be true schematically, however in a practical implementation it may be preferable to output the digital output signals from the ADC banks in parallel.

Calibration unit 52 is connected to receive a signal or signals from the digital unit 50 and, based on that signal, to determine control signals to be applied to one or more of the sampler 42, VCO 44, demultiplexers 46 and ADC banks 48. As will become apparent later, it is preferable to carry out calibration on the sampler 42, which is why the output from calibration unit 52 to the sampler 42 is shown as a solid arrow in FIG. 9, rather than as a dashed arrow.

Further details regarding the operation, and related benefits, of circuitry 40 will become apparent through consideration of FIGS. 10 to 27.

Figure 10:
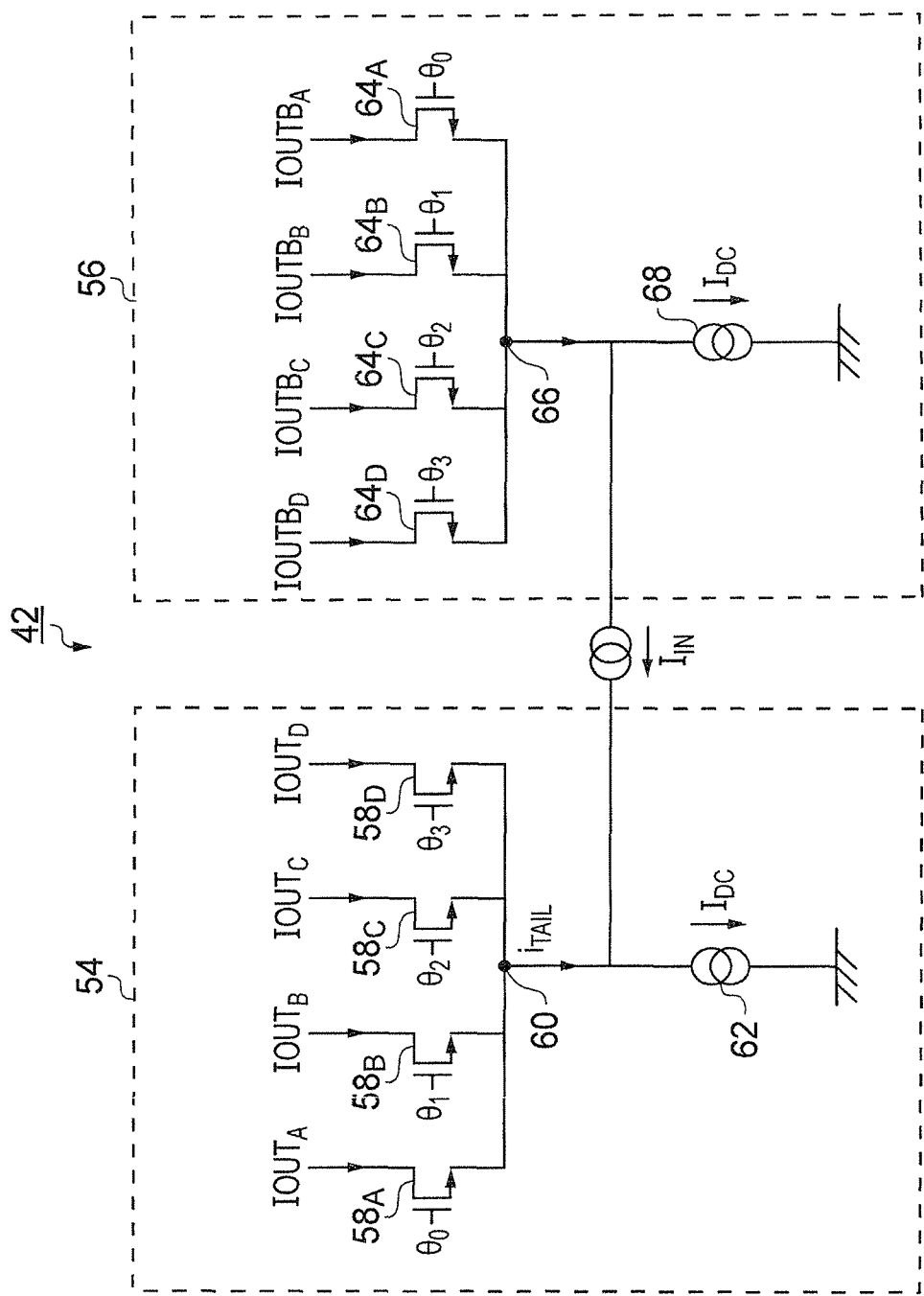
FIG. 10 is a schematic circuit diagram of a four-phase current-mode sampler embodying the present invention.

FIG. 10 is a schematic circuit diagram of four-phase (i.e. multiphase) current-mode (current-steering) sampler 42. Although in FIG. 9 a single-ended input signal, current $I_{IN}$, is shown, it will be appreciated that a differential input signal could be employed, for example to take advantage of common-mode interference rejection. Accordingly, the sampler 42 and demultiplexers 46 and ADC banks 48 could be effectively duplicated in circuitry 40 to support such differential signaling, however such duplication is omitted from FIG. 9 for simplicity. Returning to FIG. 10, sampler 42 is configured to receive such a differential input current signal, modeled here as a current source $I_{IN}$ whose magnitude varies with the input signal.

Because of the differential signaling, sampler 42 effectively has two matching (or corresponding or complementary) sections 54 and 56 for the two differential inputs. Accordingly, there is a first set of output streams $IOUT_A$ to $IOUT_D$ in section 54 and a second set of matching output streams $IOUTB_A$ to $IOUTB_D$, where IOUTB means $\overline{IOUT}$, and wherein $IOUT_A$ is paired with $IOUTB_A$, $IOUT_B$ is paired with $IOUTB_B$, and so on and so forth.

Focusing on the first section 54 by way of example (because the second section 56 operates analogously to the first section 54), there are provided four n-channel MOS-FETs $58_A$ to $58_D$ (i.e. one per stream or path) with their source terminals connected together at a common tail node 60.

The aforementioned current source $I_{IN}$ is connected between common tail node 60 and an equivalent common tail node 66 of section 56. A further current source $I_{DC}$ 62 is connected between the common tail node 60 and ground supply, and carries a constant DC current $I_{DC}$. The gate terminals of the four transistors $58_A$ to $58_D$ are driven by the four clock signals $\theta_0$ to $\theta_3$, respectively, provided from the VCO 54.

As mentioned above, section 56 is structurally similar to section 54 and thus comprises transistors $64_A$ to $64_D$, common tail node 66 and current source $I_{DC}$ 68.

Operation of the sampler 42 will now be explained with reference to FIGS. 11 to 16.

Figure 11:
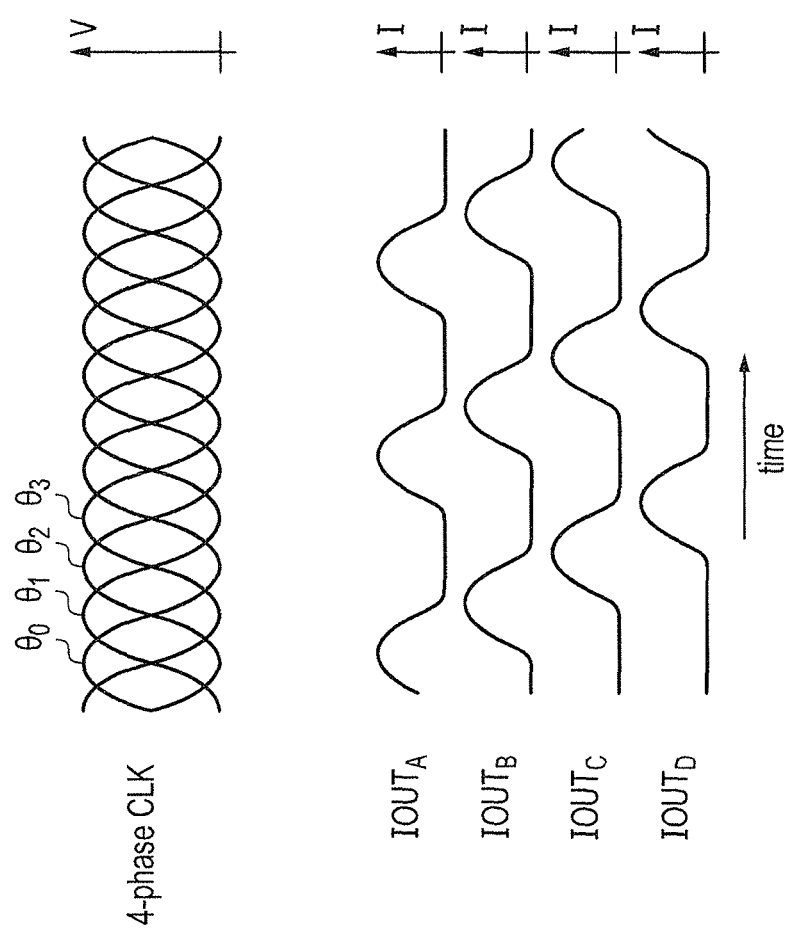
FIG. 11 shows schematic waveforms of clock signals $\theta_0$ to $\theta_3$ and output currents $IOUT_A$ to $IOUT_D$.

FIG. 11 shows schematic waveforms for the clock signals $\theta_0$ to $\theta_3$ in the upper graph, and schematic waveforms for the corresponding output currents $IOUT_A$ to $IOUT_D$ in the lower graph.

The clock signals $\theta_0$ to $\theta_3$ are time-interleaved raised cosine waveforms provided as four voltage waveforms from the VCO 44. The use of four clock signals in the present case is due to the four-way-interleaving design of ADC circuitry 40, but it will be appreciated that, in another embodiment, three or more time-interleaved clock signals could be used, for a three-or-more-way split of the input current signal.

Clock signals $\theta_0$ to $\theta_3$ are 90° out of phase with one another, such that $\theta_0$ is at 0° phase, $\theta_1$ is at 90° phase, $\theta_2$ is at 180° phase, and $\theta_3$ is at 270° phase.

The effect of sampling circuitry 42, under control of clock signals $\theta_0$ to $\theta_3$, is that the output currents $IOUT_A$ to $IOUT_D$ are four trains (or streams) of current pulses, the series of pulses in each train having the same period as one of the clock signals $\theta_0$ to $\theta_3$, and the pulses of all four trains together being time-interleaved with one another as an effective overall train of pulses at a quarter of the period of one of the clock signals (or at four times the sampling frequency of one of the clock signals).

FIG. 12 shows more waveforms for the clock signals $\theta_0$ to $\theta_3$ in the upper graph, and partial waveforms for the currents $IOUT_A$, $IOUT_B$ and $IOUT_D$ (current $IOUT_C$ is not shown) in the lower graph, for use in better understanding the operation of sampling circuitry 42.

As mentioned above, clock signals $\theta_0$ to $\theta_3$ are time-interleaved raised (substantially) cosine waveforms and are 90° out of phase with one another. The clock signals shown are sinusoidal, but need not be strictly-perfect sinusoids. As will become apparent, in the present embodiment the shape of the waveforms is more important in the uppermost part than towards the bottom. For the benefit of further explanation, clock signal $\theta_0$ is highlighted in bold in FIG. 12.

Clock signals $\theta_0$ to $\theta_3$ control the gates of transistors $58_A$ to $58_D$, respectively, in sampler 42. Accordingly, transistors $58_A$ to $58_D$ are turned on and then off in sequence, such that as one of them is turning off the next in sequence is turning on, and such that when one of them is turned fully on the others are substantially turned off.

Because substantially all current entering node 60 via transistors $58_A$ to $58_D$ must exit that node as current $I_{TAIL}$, then the sum of currents $IOUT_A$ to $IOUT_D$ at any time must be substantially equal to $I_{TAIL}=I_{DC} I_N$. The effect of the gate control mentioned above is therefore that current $I_{TAIL}$ is steered to pass through transistors $58_A$ to $58_D$ in the sequence in which those transistors are turned on and off, i.e. such that as one of them is turning off and thus starts to carry less of $I_{TAIL}$, the next in sequence is turning on and thus starts to carry more of $I_{TAIL}$, and such that when one of them is turned fully on, it carries substantially all of $I_{TAIL}$ because the other transistors are substantially turned off.

This effect is shown in the lower graph of FIG. 12. Only output currents $IOUT_A$, $IOUT_B$ and $IOUT_D$ are shown for simplicity, however the pattern of waveforms shown continues in a similar way as shown in FIG. 11. For comparison with the upper graph of clock signals, the waveform for output current $IOUT_A$ (corresponding to clock signal $\theta_0$) is highlighted in bold.

In order to gain an understanding of the lower graph in FIG. 12, three points, 70, 72 and 74 are indicated on waveform $\theta_0$ and a corresponding three points 80, 82 and 84 are indicated on waveform $IOUT_A$.

At point 70, waveform $\theta_0$ is at its peak value, i.e. at $V_{DD}$, and the other clock signals $\theta_1$ to $\theta_3$ are significantly below their peak value. Accordingly, transistor $58_A$ is fully on and transistors $58_B$ to $58_D$ are substantially off. Therefore, at the corresponding point 80, current $IOUT_A$ is equal to $I_{TAIL}$ and the other currents $IOUT_B$ and $IOUT_D$ (and current $IOUT_D$ not shown) are substantially equal to zero.

At point 72, which precedes point 70, waveform $\theta_0$ is rising towards its peak value but has not yet reached its peak value. Also, at point 72, waveform $\theta_3$ is falling from its peak value. Importantly, at point 72 clock signals $\theta_3$ and $\theta_0$ have equal values. Therefore transistors $58_D$ and $58_A$ are on to the same extent as one another, because their source terminals are connected together. At point 72, clock signals $\theta_1$ and $\theta_2$ are also equal to one another and are sufficiently low to ensure that transistors $58_B$ and $58_C$ are off. Thus, at this point in time, half of current $I_{TAIL}$ flows through transistor $58_D$ and half of it flows through transistor $58_A$, as indicated by point 82, such that $IOUT_D=IOUT_A=(I_{TAIL})/2$.

Point 74 is equivalent to point 72, except that at this point it is transistors $58_A$ and $58_B$ that are both on. Therefore, at corresponding point 84, $IOUT_A=IOUT_B=(I_{TAIL})/2$.

It will therefore be appreciated that the three points for each current waveform (e.g. points 80, 82 and 84 for current waveform $IOUT_A$) are fixed in time relative to the clock waveforms and in magnitude relative to the current $I_{TAIL}$. That is, taking current $IOUT_A$ as an example, at point 80 the current is equal to $I_{TAIL}$ and at points 82 and 84 the current is equal to half $I_{TAIL}$. The location of points 80, 82 and 84 is fixed relative to the clock signals $\theta_0$ to $\theta_3$. The same is true for currents $IOUT_B$ to $IOUT_D$. The focus on points 70, 72 and 74 demonstrates that for the present embodiment the upper part of the clock signals is important, and that the lower parts are less important (such that, for example, the precise shape of the lower parts is not strictly critical).

Thus, the current pulses of waveforms $IOUT_A$ to $IOUT_D$ are all of the same shape, and that shape is defined by the raised cosine shape of the clock signals. As the value of $I_{TAIL}$ fluctuates with input current $I_{IN}$, the pulses are simply scaled up or down accordingly. This can be seen from FIG. 13, which shows waveforms for $IOUT_A$ to $IOUT_D$ as $I_{TAIL}$ increases and then decreases again. The peaks of the pulses follow $I_{TAIL}$, and the points where two adjacent pulses have equal value (i.e. the crossing points) follow half $I_{TAIL}$.

This operation has considerable benefits.

Figure 1:
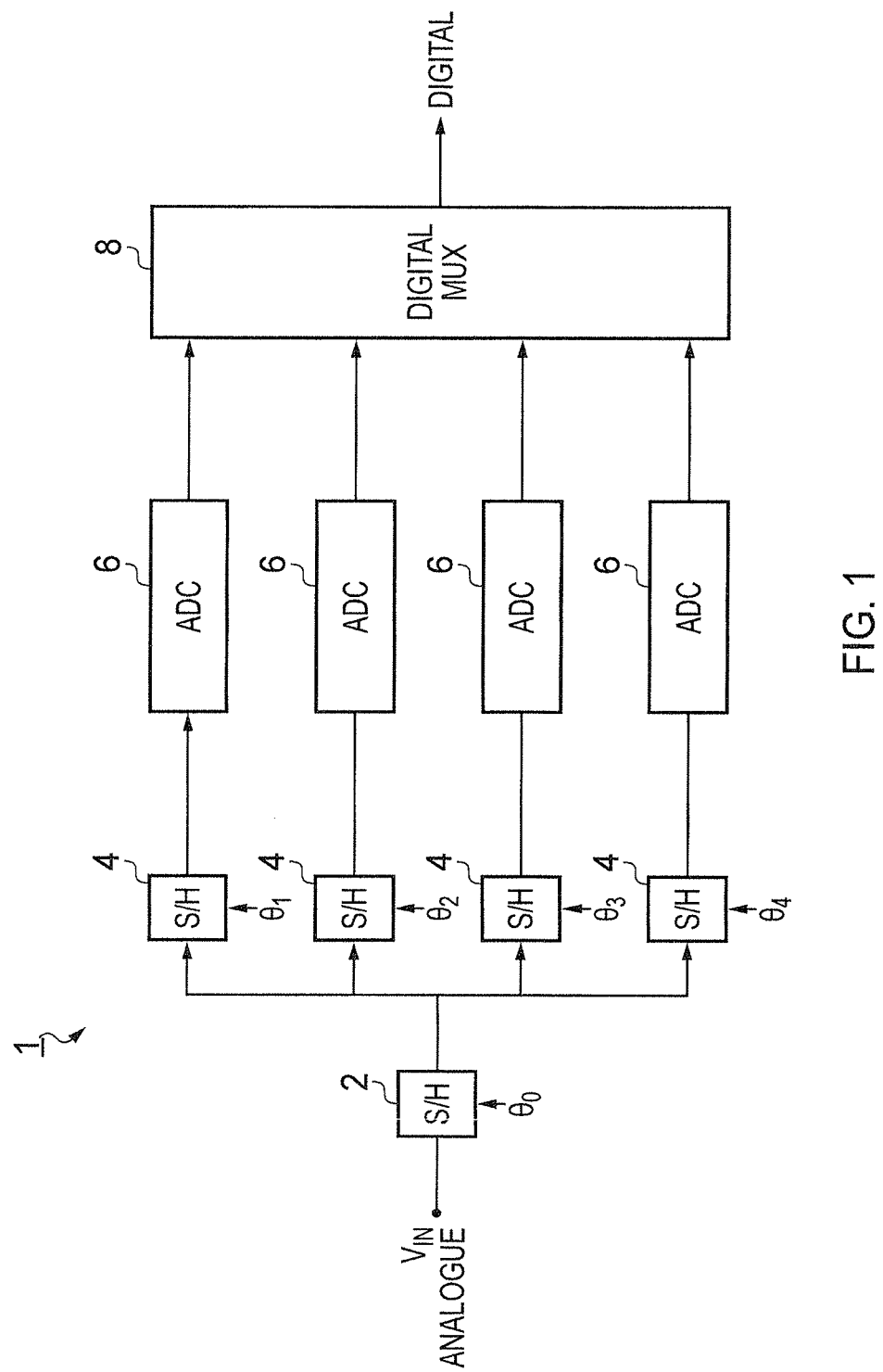
Figure 2:
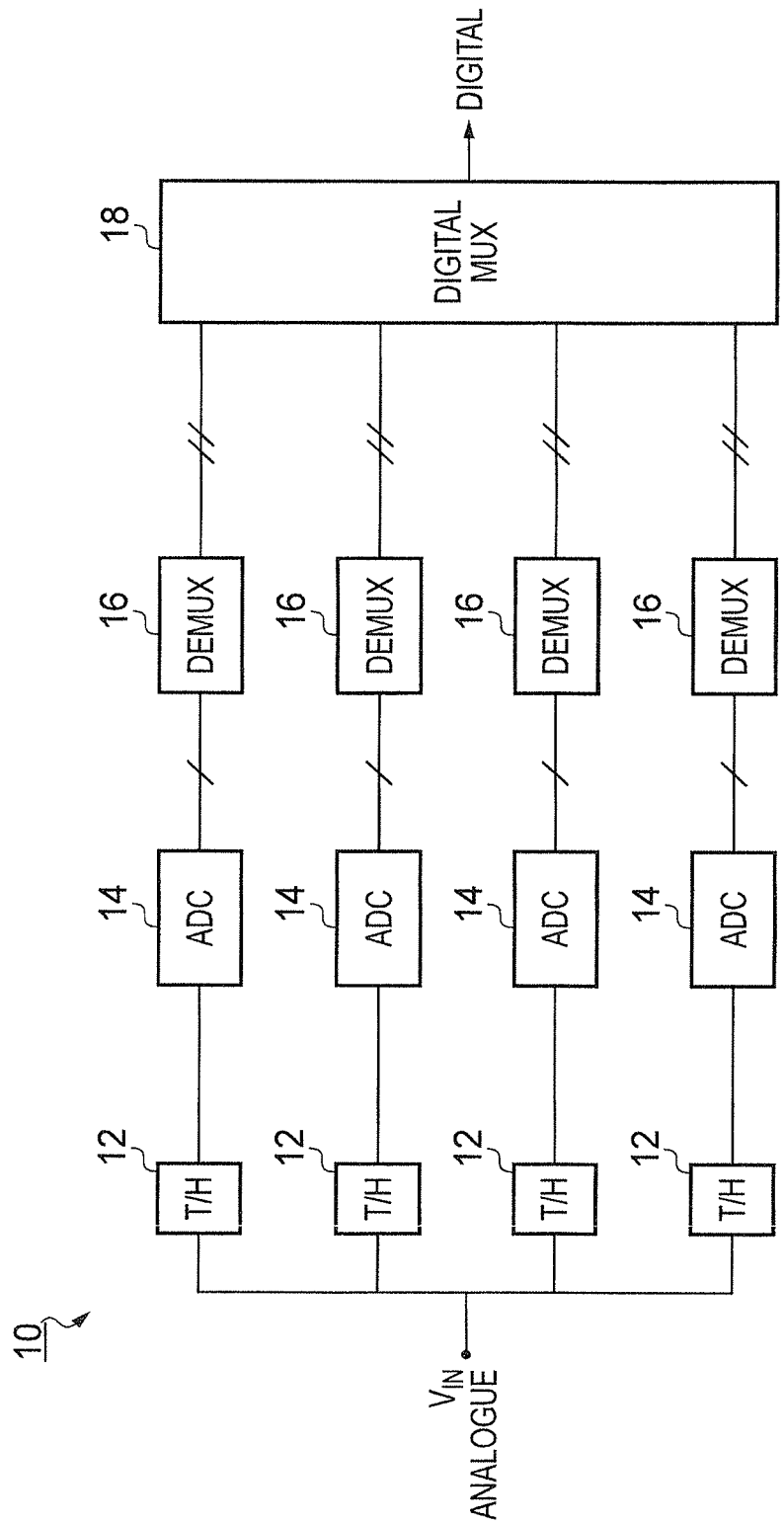
Figure 3:
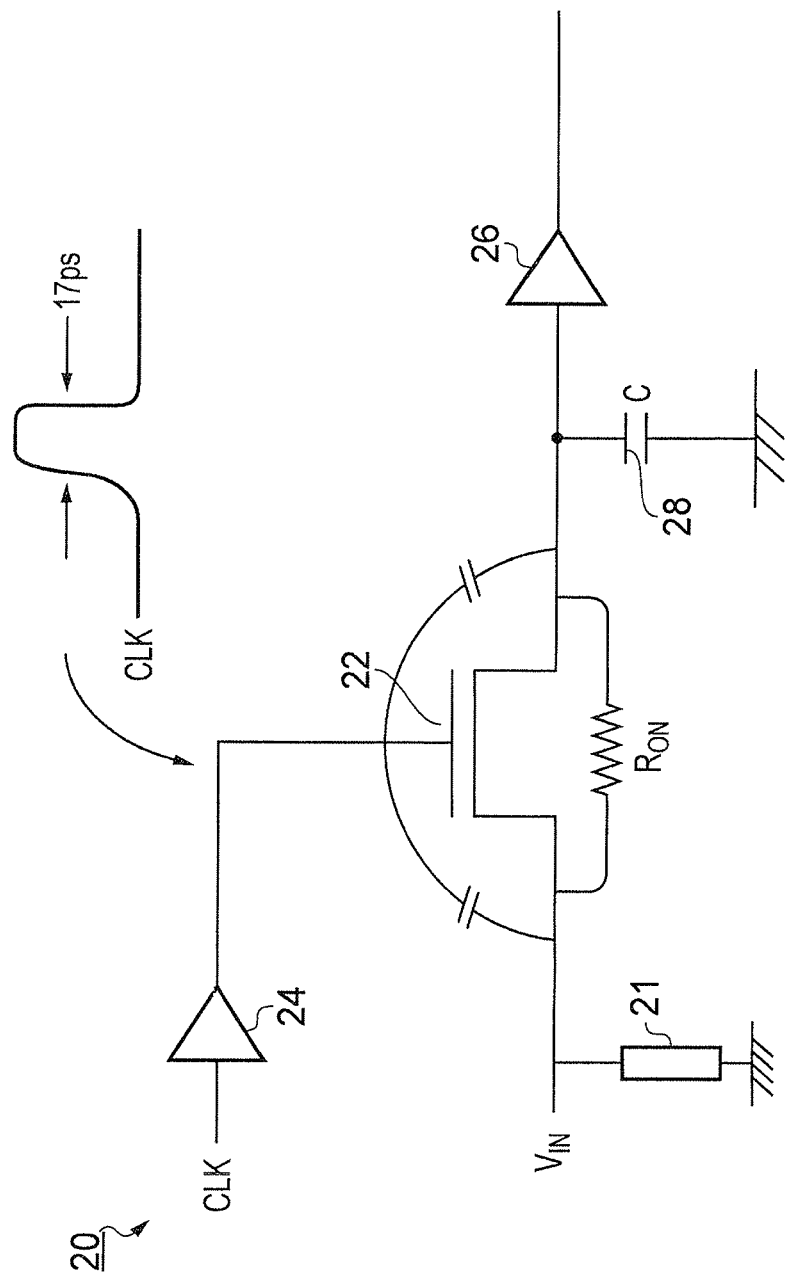
Figure 4:
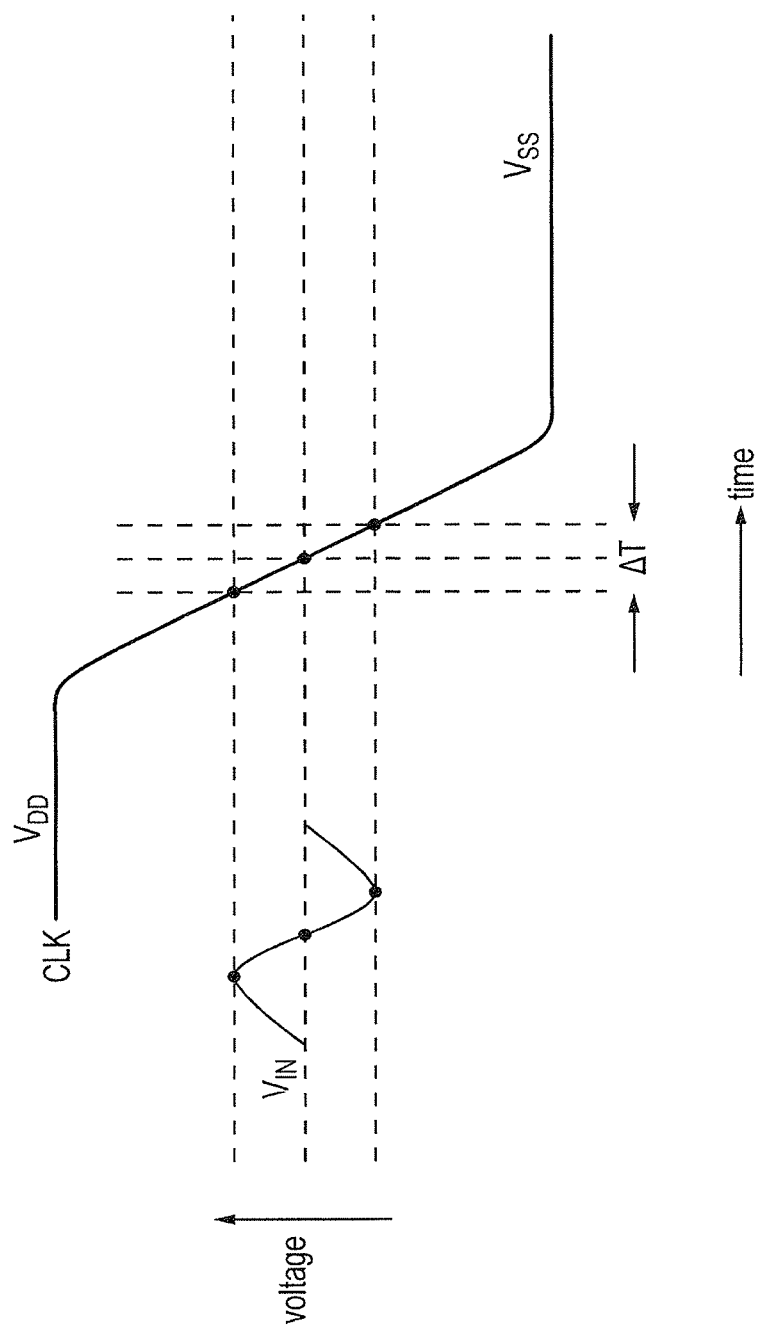
Figure 5:
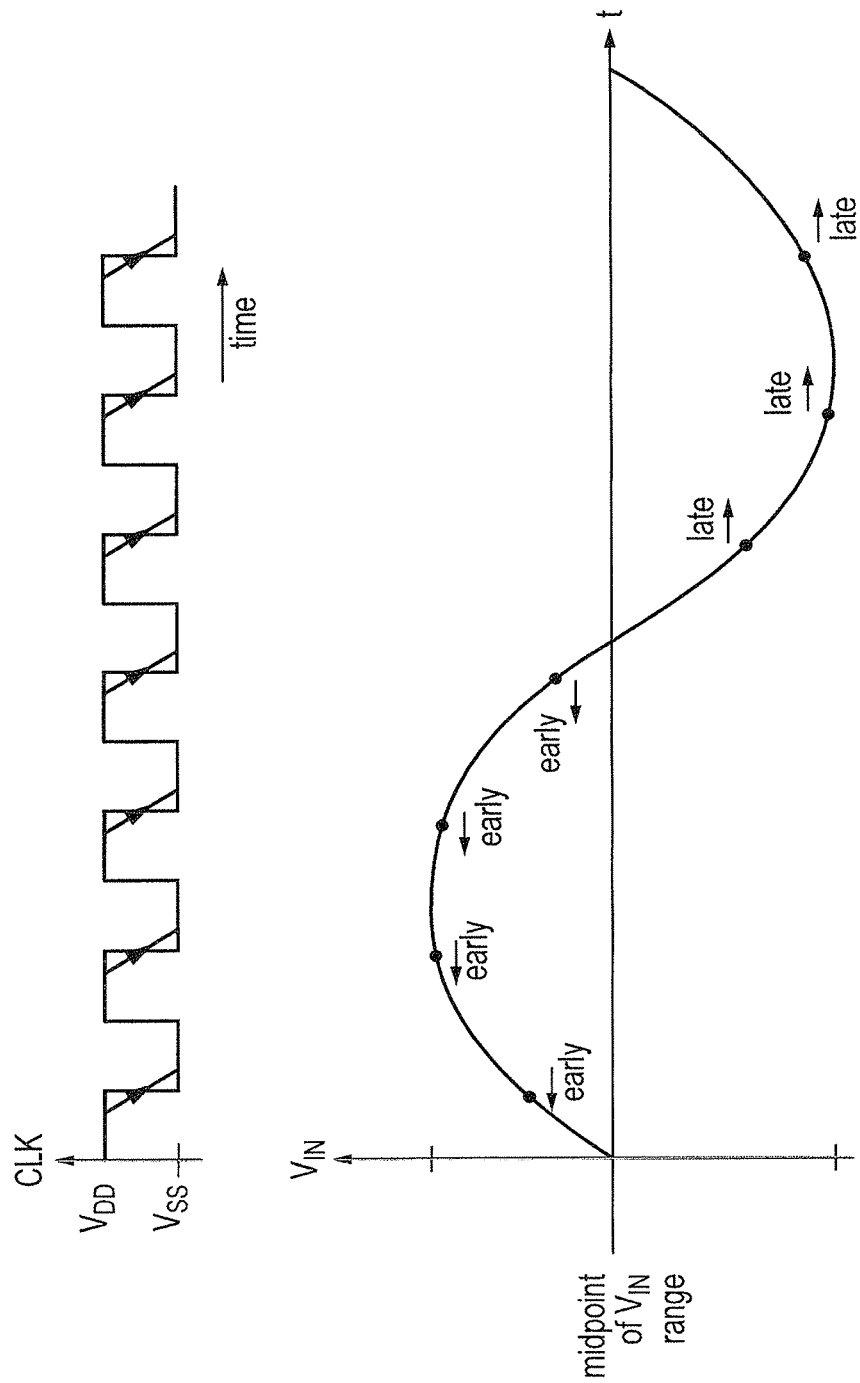
Figure 6:
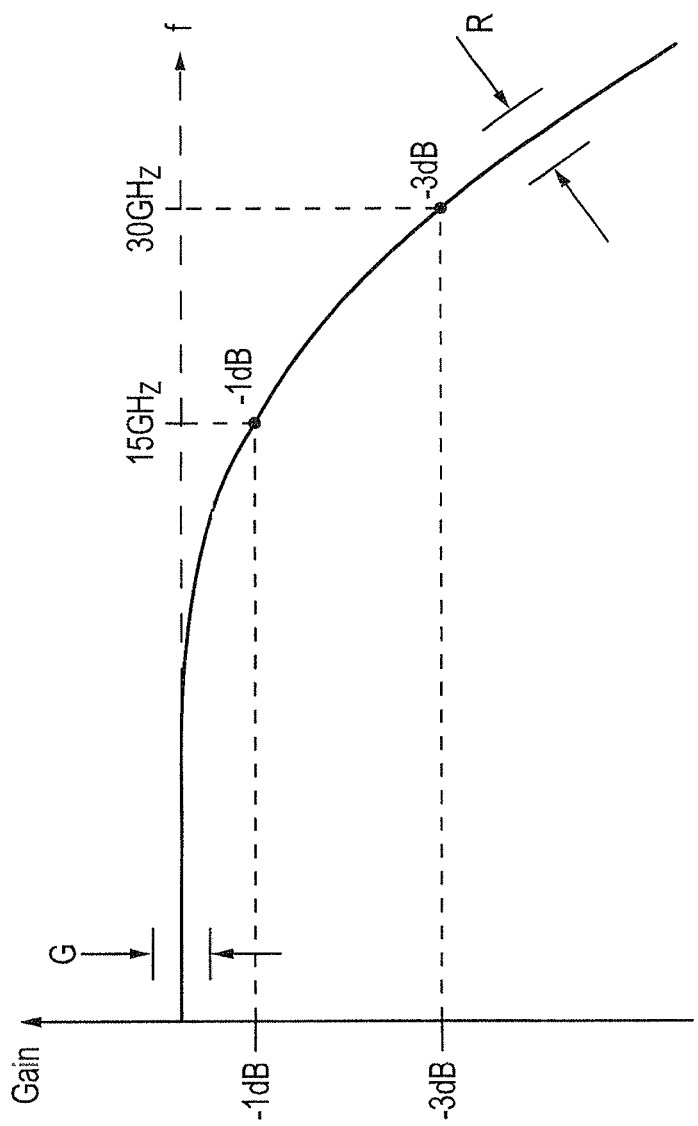
Figure 7:
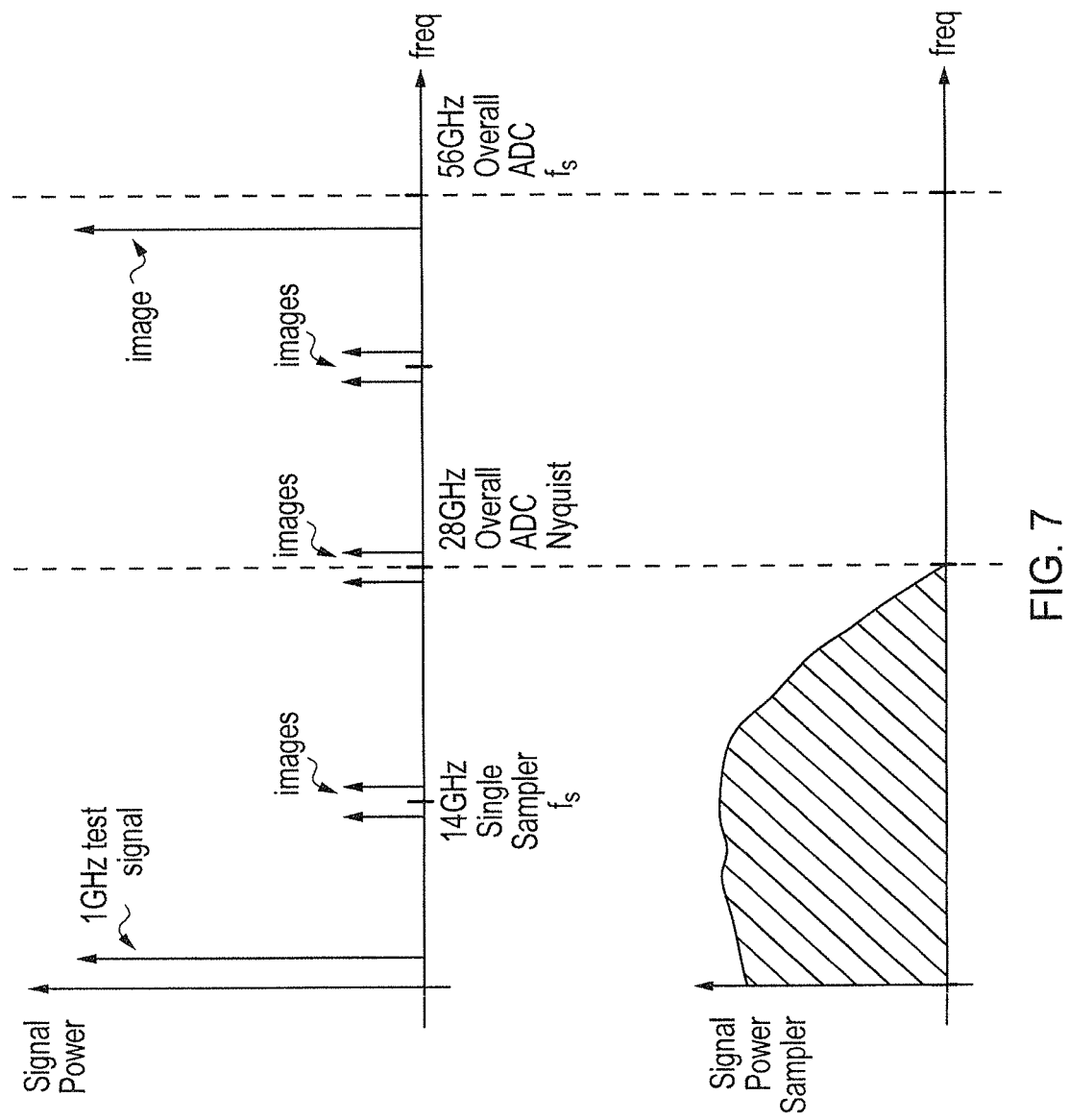

Because the sampling pulses all have the same shape, defined by the raised cosine clock waveforms, the frequency response/roll-off is thereby defined mathematically by the cosine curve and as a result the analogue bandwidth from the input $I_{IN}$ to the output $I_{OUT}$ is very high, typically greater than 100 GHz. Furthermore, the voltage level at the tail nodes in the circuitry (e.g. nodes 60 and 66 in FIG. 10) does not fluctuate much during operation. By way of explanation, in FIG. 10 the switches are nMOS switches, operated in the saturated region, with their source terminals tied together to form the tail node concerned. Thus, those switches operate as cascodes with a low input impedance and a high output impedance. Because the voltage level at the tail nodes doesn't move much with the input signal, those nodes may be considered to be virtual grounds, and have a reduced sensitivity to parasitic capacitances at those tail nodes. In FIG. 3, the transistor 22 has to drive capacitor 28. There is thus a high resistance and relatively high capacitance giving a relatively low bandwidth, and the bandwidth is unpredictable because of the significant mismatch in capacitor 28. In contrast, in the present embodiment the nMOS switches do not have to drive a capacitor 28; they have a low on resistance and the tail nodes have a tiny parasitic capacitance (to which the tail node is insensitive as mentioned above). This gives a high bandwidth that is accurate and repeatable. In summary, the circuitry of the present embodiment is a fast analogue circuit carrying current pulses of a defined shape. The circuitry thus has a high bandwidth that is known, repeatable, accurate and constant. This known bandwidth may thus be compensated for with a filter (as mentioned below), for example digitally. As will become apparent later, the demultiplexers 46 operate in a similar way to the sampler 42, leading to this high-bandwidth accurate operation over the sampling and demultiplexing circuitry.

Moreover, the sampling circuitry 42 operates by genuinely steering the current $I_{TAIL}$ whose magnitude is dependent upon input signal $I_{IN}$ via the different outputs $IOUT_A$ to $IOUT_D$. The input current $I_{TAIL}$ is not copied (in the way that voltages are copied in voltage-mode ADCs) from stage to stage (the demultiplexers 46 having a similar structure and method of operation to the sampling circuitry 42 and thus forming subsequent such stages). Instead, it is the actual current $I_{TAIL}$ that is steered or routed through the circuitry. All of the current $I_{TAIL}$ passes through to the outputs. It is noted that although the direction of flow of conventional current in this case is from output to input, the principles are the same for current flowing from input to output, and indeed the graphs of currents $IOUT_A$ to $IOUT_D$ are shown as positive values (with the direction of those currents shown, e.g. in FIG. 10, as from output to input) to aid conceptual understanding of the operation of the circuitry. In summary, if all of the "output" currents are summed together, the result would be the same as $I_{TAIL}$.

Another advantage of this operation of the sampler 42 is that the operation does not suffer from significant input-signal-dependent sampling delays. As will become apparent below, and as briefly discussed above, the voltage at common tail nodes 60 and 66 can be configured to be very stable during operation, such that it is only susceptible to around 50-70 mV ripple. The sampling timing is purely governed by the clock signals $\theta_0$ to $\theta_3$ as explained above (because the source terminals of the switching transistors are all tied together). Therefore, a change in $I_{IN}$ does not cause any signal-dependent delay, in contrast to the signal-dependent delay as explained earlier with reference to FIGS. 3 to 5. Accordingly, related distortion is also obviated.

Assuming that the clock signals $\theta_0$ to $\theta_3$ are perfect, i.e. free of amplitude noise and phase noise (jitter), then any errors are mainly (i.e. ignoring insignificant signal-dependent errors) due to mismatches between the switching transistors (and such mismatches are dealt with later).

Another advantage is that even if there are some sampling errors, due for example to clock skew and/or mismatches, the input current $I_{TAIL}$ (which is dependent on the input $I_{IN}$) must still be divided between the output currents $IOUT_A$ to $IOUT_D$. That is, current is not lost; generally speaking, all current that goes in must come out. This principle proves particularly useful for calibrating operation of the ADC circuitry 40, as will be described in detail below.

Because four time-interleaved sinusoidal clock signals (in this case, raised cosines) are employed in the present embodiment, the 25% duty-cycle pulses required to drive the corresponding four switches (e.g. switches $58_A$ to $58_D$ in FIG. 10) are formed even though the clock signals themselves (being sinusoids) naturally have a 50% duty cycle. That is, for an X-way split of the input current signal (X=4, above), it is possible to use 50% duty-cycle sinusoidal clock signals to produce 100/X % duty-cycle pulses. In contrast, if switched logic-level (hard-switched) clock signals were employed, it would be necessary to use clock signals themselves having a 100/X % (25%, for X=4) duty cycle to produce 100/X % (25%, for X=4) duty-cycle pulses. Therefore, the present embodiment is advantageous, particularly when considering high-frequency operation, as 50% duty-cycle clock signals may be employed (even when X=3 or more).

Yet a further advantage of sampler circuitry 42 is that the gates of the transistors may be driven directly without requiring an intermediate buffer such as buffer 24 in FIG. 3. This is because VCO outputs tend to be sinusoidal and the present circuitry is configured to accept sinusoidal clock signals. Such direct driving may include intermediate AC coupling, e.g. via a capacitor. With such direct driving, the gate capacitances of the transistors of the sampler circuitry 42 can be included in the VCO 44 design as being part of necessary capacitance within the VCO. Thus, the gate capacitances are effectively absorbed within the VCO, such that the sampler circuitry 42 operates as if there were zero gate capacitance. Thus, switching delays due to gate capacitances are effectively removed. Furthermore, the ability to not employ buffers such as buffer 24 to generate square (i.e. pulsed or switched-logic) waves allows associated noise and delay mismatch to be avoided. For example, if quadrature square waves were required, then four buffers with associated mismatch would be required.

FIG. 14 shows simulation results for sampler circuitry 42. For the purposes of the simulation, the circuitry 42 has been configured to operate at 56 GS/s and is supplied with an input current signal $I_{IN}$ having the form of a 1 GHz sinewave.

The uppermost of the four graphs shows the four clock signals $\theta_0$ to $\theta_3$, each being a 14 GHz raised cosine signal, thereby enabling the overall desired 56 GS/s sampling rate. The second of the four graphs from the top shows the four output signals $IOUT_A$ to $IOUT_D$ of section 54 and the third of the four graphs shows the equivalent traces for output signals $IOUTB_A$ to $IOUTB_D$ of section 56. The lowermost graph shows the difference between the two components of the differential output signal, i.e. generically IOUT–IOUTB. In such differential circuitry, it is the "difference" signal that is the desired output.

FIG. 15 shows an enlarged portion of the simulation results of FIG. 14, in which the pulse shapes and clock signals are more clearly shown.

The resulting fixed pulse shape can be clearly seen. The peaks of the pulses in the middle two graphs follow $I_{TAIL}$ and thus fluctuate around a DC level defined by the DC current sources 62 and 68. The circuitry component values used for the simulation were similar to those employed in the FIG. 16 circuitry (described below), except that the impedances were halved, the current sources were doubled, and 250 resistors were provided in series at the inputs VINP and VINM. This enabled the input impedance to remain on target, the voltage swings to remain the same, and the current signals to be doubled. The overall input 1 GHz signal can be seen as the envelope of the lower graph. The input signal is represented both by the peak values of the successive pulses, and by the areas under the successive pulses; because of the defined shape of the pulses, the peak values double as the areas double, and vice versa.

As already mentioned, ADC circuitry 40 operates in the current domain, i.e. effectively as a current-mode ADC. As a result, the input signal required is a current signal. However, typical signals that require use of an ADC or sampler are voltage-domain signals, in which the variable under examination is a voltage rather than a current. FIG. 16 is a schematic circuit diagram of an example implementation 102 of sampling circuitry 42, to which it is possible to apply an input differential voltage signal.

Implementation 102, similarly to circuitry 42, comprises two sections 54 and 56 for the so-called "plus" and "minus" components of the differential signals. Section 54 comprises switching transistors $58_A$ to $58_D$ connected to common tail node 60, and section 56 comprises switching transistors $64_A$ to $64_D$ connected to common tail node 66, as before.

Implementation 102 basically works by receiving the input voltage signal and by employing resistances to passively convert the received input voltage signal into an equivalent input current signal. Implementation 102 therefore comprises input terminals 104 (VINP) and 106 (VINM) to receive the "plus" and "minus" components of the input voltage signal, respectively.

Input terminals 104 and 106 are each connected to a shared terminal 108 via a resistor 110 and an inductor 112. Input terminals 104 and 106 are further each connected to their corresponding common tail nodes 60 and 66 via a resistor 114. Shared terminal 108 is connected via shared DC current source 116 to a reference potential whose voltage level is below that of VINP and VINM, and may indeed be negative.

An example set of resistance values are shown in FIG. 16. These values have been chosen assuming an example design objective that the input impedance looking into each of the common tail nodes 60 and 66 towards the switching transistors (sampler switches) is 50Ω, and that the input impedance looking into each of the input terminals 104 and 106 is also 50Ω as shown in FIG. 16. A further example aim is for the circuitry to have an analog bandwidth from VIN to IOUT of more than 100 GHz when implemented in 65 nm silicon technology.

By setting resistor 110 as 100Ω and resistor 114 as 50Ω, it is possible to obtain an impedance $Z_1$ looking into the input terminals 104 and 106 towards the respective common tail nodes 60 and 66 of 100Ω at DC and 50Ω at high frequency (e.g. at 100 GHz), an impedance $Z_2$ looking into the input terminals 104 and 106 towards the shared terminal 108 of 100Ω at DC and infinity at high frequency, and therefore a total input impedance $Z_{IN}$ at each input terminal 104, 106 of 50Ω over the full bandwidth. This is because the sampler switches look capacitive at around 100 GHz and are compensated by the series inductors 112 (around 100 pH) in the tail. An advantage of the infinite impedance $Z_2$ at high frequency is that shared node 108 effectively serves as an AC ground such that the operation of the circuitry is shielded from any capacitance in the shared current source 116. Put simply, the inductance 112 isolates any capacitance in the current source 116 because they compensate for one another. Put another way, because the circuit is differential and balanced, the voltage at node 108 doesn't move much, so there is no signal on node 108 and that node is insensitive to capacitance.

With this design, it is found that the circuit has the desired 50Ω input resistance at DC to over 100 GHz, and that this is possible (i.e. that the input resistance is stable over frequency) even if the resistances have a +/−10% tolerance (not trimmed). That is, the tolerance on the resistances may lead to a slight ripple towards the middle of the frequency response, but this is considered acceptable in practical embodiments. It is also found that by applying the voltage input between the two input terminals 104 and 106 as a 600 mVpp signal, by way of example, this gives about +/−75 mV ripple at the common tail nodes 60 and 66, and about +/−50% current modulation in the sampling switches with $I_{DC}$=6.5 mA.

Advantages of this circuit design thus include that $Z_{IN}$=50Ω, the capacitance in the current source 116 has substantially no effect, and that the bandwidth is very wide (greater than 100 GHz). Furthermore, by employing the series resistors 110 and 114, the circuitry has inherent ESD (electrostatic discharge) immunity, and it is possible to reduce or even remove ESD diodes at circuitry input pins. Furthermore, the $V_{IN}$ common-mode is around 0 and the current source 116 is below GND (as mentioned above), and only a low current negative supply is needed, e.g. −1V.

To gain a better appreciation of the advantages which arise from the V-I circuitry of FIG. 16, a comparison may be made with V-I conversion circuitry which may have appeared more suitable in ADC circuitry, without knowledge of the present invention. In particular, a transconductance stage (i.e. an active V-I conversion circuit) is one type of V-I conversion circuit which may be considered for use in ADC circuitry. A transconductance stage can, for example, be useful for providing a true V-I conversion even if there is expected voltage ripple at the node (e.g. node 60 in FIG. 16) to which the current signal is to be applied. However, the input impedance of such an active transconductance stage has a relatively low bandwidth limit (e.g. 10 GHz), rendering it unsuitable given the example aims mentioned above (i.e. a desired bandwidth of more than 100 GHz). At high frequency (e.g. above 10 GHz), such a transconductance stage can become a significant noise and distortion contributor, and can also make input matching poor. In contrast, the present example implementation 102 provides passive conversion means with substantially constant (i.e. resistive) input impedance over frequency (in the example above, there is provided 500 input impedance at DC to over 100 GHz). The example implementation 102 enables good input matching and can be used at high frequency without being a significant noise or distortion contributor. In practical embodiments of the present invention, it has been found that the ripple at the tail nodes (e.g. nodes 60 and 66 in FIG. 16) may be tolerated because a sufficient degree of linearity may still be achieved (e.g. an ENOB of 8).

FIG. 17 is a schematic circuit diagram of parts of ADC circuitry 40 useful for understanding the structure and operation of the demultiplexers 46.

For simplicity, only part of the sampler circuitry 42 is shown, employing the implementation 102 of FIG. 16. That is, only the "plus" section 54 is shown, and elements of that "plus" section 54 are omitted to avoid over-complicating FIG. 17.

Regarding the demultiplexers 46, only the demultiplexing circuitry 46 for output $IOUT_A$ is shown. Similar circuitry may also be provided for the other seven outputs $IOUT_B$ to $IOUT_D$, and $IOUTB_A$ to $IOUTB_D$.

As shown in FIG. 17, demultiplexers 46 in the present embodiment are formed of two stages, namely stages 46A and 46B. The first stage 46A performs 1:N demultiplexing, and the second stage 46B performs 1:M demultiplexing.

Stages 46A and 46B generally have the same structure as the array of sampling switches 110 of the sampling circuitry 42. That is, each stage comprises a plurality of transistors (in this case, n-channel MOSFETs) whose source terminals are connected together at a common tail node.

From the above description of sampling the circuitry 42, and considering only the "plus" section 54 by way of example, it will be appreciated that the circuitry splits the input current $I_{IN}$ into X time-interleaved trains of pulses, where X=4 in the present embodiment. In the present embodiment, those pulse trains are provided at outputs $IOUT_A$ to $IOUT_D$. Sampling circuitry 42 can thus be thought of as performing a 1:X demultiplexing function. In the same way, each output from sampler 42 can be further 1:N demultiplexed by a stage 46A, and each output of a stage 46A can be further 1:M demultiplexed by a stage 46B.

Only one complete demultiplexed path is shown in FIG. 17. That is, input current $I_{IN}$ is demultiplexed to provide X (X=4 in the present case) outputs $IOUT_A$ to $IOUT_D$. Each of those outputs is then 1:N demultiplexed by a stage 46A, however this is only shown in FIG. 17 in respect of the left-most output $IOUT_A$. Consequently, the outputs from that shown stage 46A are outputs $IOUT_{A10}$ to $IOUT_{A1(N-1)}$. Each of those outputs (for all stages 46A) is then 1:M demultiplexed by a stage 46B, however this is again only shown in FIG. 17 in respect of the left-most output $IOUT_{A10}$. Consequently, the outputs from that shown stage 46B are outputs $IOUT_{A1020}$ to $IOUT_{A102(M-1)}$. Corresponding outputs are produced by the other stages 46B.

The sampling circuitry 42 and demultiplexers 46 together carry out a 1:Z demultiplexing function, where Z=X×N×M. In the present embodiment, X=4, N=8 and M=10. Thus, the present embodiment performs 1:320 demultiplexing, which leads to 320 outputs on the "plus" side 54 and a corresponding 320 outputs on the "minus" side 56.

FIG. 18 is a schematic diagram useful for understanding further the operation of demultiplexers 46. The uppermost trace shows a pulse train at output $IOUT_A$ of the sampling circuitry 42, and the traces below represent corresponding pulse trains of outputs $IOUT_{A10}$ to $IOUT_{A1(N-1)}$ (only $IOUT_{A10}$ to $IOUT_{A13}$ are shown) of a stage 46A. As can be appreciated from FIG. 18, pulse train $IOUT_A$ is effectively split up into N pulse trains each at 1/N the sample rate of pulse train $IOUT_A$.

Returning to FIG. 17, it will be appreciated that although the clock signals $\theta_0$ and $\theta_3$ supplied to sampling circuitry 42 are, in this embodiment, low-voltage (e.g. having 0 V to 0.8 V clock levels) raised cosine waveforms (which lead to the related advantages discussed earlier), the specifications for the clock signals applied to stages 46A and 46B of the multiplexers 46 can be somewhat relaxed in comparison. This is because by that stage the samples have already been taken, and because at successive stages the sample rate becomes much reduced. The clock performance at successive stages therefore becomes less critical. As a result, for example, the clock signals applied to stages 46A and 46B could be digital clock signals (i.e. square-wave, pulsed, or switched-logic signals) rather than sinewaves, and could be higher voltage signals for example with 0 V to 1.2 V clock levels. It is noted, however, that for the purpose of the simulations whose results are presented herein, sinewave clock signals were applied throughout. An important point to note is that the demultiplexers 46 are not significant sources of error; they pass the current pulses on with their respective areas unchanged, even with reduced bandwidth.

Accordingly, as is apparent from FIGS. 16 and 17, the sampling and demultiplexing circuitry of the present embodiment forms a series of nodes connected together in a tree structure. This is true for both complementary parts of the circuitry, looking at, for example, FIG. 16. In FIG. 16, node 60 may be considered a root node of its tree structure, with the next tier of nodes having outputs $IOUT_A$ to $IOUT_D$, and (moving to FIG. 17) the next tier of nodes having (amongst others not shown) outputs $IOUT_{A1020}$ to $IOUT_{A102(M-1)}$. As mentioned above, the sample-rate reduction from tier to subsequent tier enables the clock specifications to be relaxed from tier to subsequent tier. Despite this relaxation from tier to tier, because the samples are taken in the sampler circuitry (between the root and first-tier nodes), the samples can then pass through the subsequent tiers largely unaffected.

Looking back to FIG. 9, the output signals from demultiplexers 46 pass into ADC banks 48. ADC banks 48 are used to produce digital values corresponding to the areas of the respective current pulses input thereto. It is of course not essential for digital values to be output; instead, analog values could be output. Digital output values are simply a useful output format for compatibility with external digital systems, such as processors (e.g. digital signal processors, DSPs) and other computing devices.

FIG. 19 is a schematic diagram useful for understanding the principle of operation of ADC banks 48. For simplicity, only one output, $IOUT_{A1020}$, of demultiplexers 46 is shown, and consequently the ADC circuitry 48 shown represents only the ADC circuitry required for that particular output. Similar ADC circuitry 48 may be provided for all the outputs of the demultiplexers 46.

ADC circuitry 48 generally takes the form of a capacitance 150. As shown in FIG. 19, capacitance 150 may be variable in value, such that its value can be trimmed during calibration or during an initial setup phase. Generally speaking, capacitance 150 is employed to convert the current pulses from output $IOUT_{A1020}$ into voltage values $V_{OUT}$. That is, each pulse charges up capacitance 150 to a voltage proportional to the area of the pulse concerned. This is because the amount of charge in each current pulse is defined by its area ($Q=\int I\,dt$), and because the voltage across the capacitance 150 is defined by that amount of charge Q and the capacitance value C ($V=Q/C$).

The voltage $V_{OUT}$ for a particular pulse is held across capacitance 150 until the circuitry 48 is reset by reset switch 152. Whilst the voltage $V_{OUT}$ for a particular pulse is held, this analog output value can be converted into a digital output value, for example using an ADC circuit employing a successive-approximation register (SAR). In the case of differential circuitry, as in the present embodiment, each $V_{OUT}$ will have its complementary $V_{OUT}$, and the pair may be applied together to a differential comparator so that a single digital output for that pair is output.

An advantage of this mode of operation is that even if delays are experienced within the demultiplexers 46, the charge in each pulse will still make it to the relevant outputs, albeit over a slightly longer period. In that case, the voltage $V_{OUT}$ produced from the pulse remains unaffected. To illustrate this point, two examples 154 and 156 of the same current pulse are shown in FIG. 19. The first pulse 154 represents a case in which minimal delay is experienced. The second pulse 156 represents a case in which some delay is experienced, for example due to track capacitance in the circuitry. Consequently, pulse 156 is stretched in time as compared to pulse 154. Importantly, the area of the two pulses 154 and 156 is substantially the same, and thus the output voltage $V_{OUT}$ would be the same for both.

Errors (i.e. mismatches) in the values of the capacitances 150 across the ADC circuits in the ADC banks 48 (for example due to tolerance limitations) may cause errors in the output of ADC circuitry 40. It is therefore advantageous to obtain the lowest capacitance mismatch possible. Of course, in a practical embodiment, a degree of capacitance-value mismatch is inevitable. However, embodiments of the present invention have an inherent advantage in this respect over circuitry in the previously-considered voltage-mode circuitry of FIG. 3, as follows.

Firstly, mismatches in the capacitances 150 have less of an effect than mismatches in capacitances 28. This is because errors due to mismatches in capacitances 28 are caused at the initial sampling stage in circuitry 20 (where the number of such capacitances 28 is small), however errors due to mismatches in capacitances 150 in the present embodiment are caused at the final ADC stage (where the number of such capacitances 150 is large). For each of the X outputs of the sampling circuitry 42 (X=4 in the present embodiment), concentrating on one of the "plus" and "minus" halves thereof, there are N×M outputs (N=8 and M=10 in the present embodiment) each having a capacitance 150. Therefore, there is an averaging effect as regards mismatches in capacitance 150 in embodiments of the present invention that is not present in circuitry 20. It could be expected that errors due to capacitance mismatches in the present embodiment are, for this reason, reduced by a factor of the square root of the number of capacitors per capacitor in FIG. 3, i.e. by a factor of $\sqrt{N \times M}$ ($\sqrt{80}$ in the present case) relative to that in FIG. 3.

Secondly, the capacitors 28 in the FIG. 3 circuitry need to be small to achieve the desired input impedance, and at such a small size the mismatch can be large. The example size of capacitor 28 given above was 16 fF. In the present embodiment, the capacitances 150 may be relatively large, since they are not attached at the inputs. The capacitances 150 may, for example, be ten times (10×) larger than the capacitors 28. Taking the above example, capacitances 150 may have a capacitance of 160 fF. The reduction in mismatch is found to be approximately proportional to the square root of the factor increase in area taken up in silicon (assuming silicon implementation), i.e. approximately proportional to the square root of the factor increase in size of the capacitance value. In the present embodiment, it could be expected that, for this reason, errors due to capacitance mismatches are reduced by a factor of $\sqrt{10}$.

Taking the above two advantages together, in the present embodiment it could be expected that errors due to capacitance mismatches for each of the sampler channels (in the present example, there are four such channels) are reduced by a factor of $\sqrt{800}$ ($\sqrt{80} \times \sqrt{10}$), i.e. $\sqrt{N \times M \times I}$ (where I is the factor increase in size of capacitance)

FIG. 20 is a schematic diagram useful for understanding a possible application of SAR-ADC (Successive Approximation Register—Analogue-to-Digital Conversion) circuitry to circuitry 48 in FIG. 19. Such circuitry could have a cycle of phases of the form: Reset (R); Sample (S); 1; 2; 3; 4; 5; 6; 7 and 8, as shown in FIG. 20. In each Sample phase, a current pulse concerned may be converted into an output voltage $V_{OUT}$, and subsequently that voltage $V_{OUT}$ may be turned into an 8-bit digital value over the following 8 SAR stages. The next Reset stage then prepares the circuitry for the next current pulse.

FIG. 21 is a schematic diagram useful for understanding a possible layout for ADC circuitry 40. Only certain parts of circuitry 40 are shown for simplicity. As can be seen from FIG. 21, and assuming that X=4, N=8 and M=10, the sampler 42 has four outputs to four demultiplexer first stages 46A. Each demultiplexer stage 46A has 8 outputs (this is only shown for the uppermost demultiplexer first stage 46A) to 8 demultiplexer second stages 46B (only one of the 8 demultiplexer second stages 46B is shown, being for the lowermost output of the uppermost demultiplexer first stage 46A). Each demultiplexer second stage 46B has 10 outputs each to its own ADC. In the way shown in FIG. 21, it is possible to distribute the switches of the demultiplexer second stages 46B so that they are close to their respective sub-ADC circuits of the ADC bank 48, thereby to minimize track length between the final switches and the capacitances 150.

As mentioned above, with reference to FIG. 9, calibration unit 52 is provided in ADC circuitry 40 to calibrate its operation. In particular, calibration unit 52 is capable of performing such calibration of the ADC circuitry 40 in use, i.e. without the need to take it "off-line".

The operation of the calibration unit 52 relies on the principle that the sampling circuitry 42 divides up the input current into streams of current pulses, i.e. that all of the current that is sampled appears in the pulses at the output. The general idea is that timing errors in the VCO/sampler clocks or switches affect the areas of the current pulses, and therefore the ADC output value. More particularly, as illustrated in FIG. 22, because all the current is divided up into pulses, if one pulse is increased in area (from its expected area in an error-free environment) due to such an error, then another pulse or set of pulses must see a corresponding decrease in area because the input current is divided up into the output currents (without current being added or removed). Similarly, if one pulse is decreased in area due to an error, then another pulse or set of pulses must see a corresponding increase in area.

One point to note is that because the clock signals are sinusoidal (which are slow signals, in the sense of rise and fall times, in contrast to fast conventional digital switched-logic or square-wave signals), the sensitivity of the areas of the current pulses to phase or magnitude errors in the clock signals, and/or to mismatches between the sampling switches, is maximized. Put another way, taking switch mismatch as an example, the use of sinusoidal clock signals enables the gain from $\Delta V_{TH}$ (the change in threshold voltage of a sampling switch, representative of a mismatch) to $\Delta fI$ (the change in area of a resultant current pulse caused by the change in threshold voltage) is maximized. This sensitivity allows these types of error to be detected more easily than if the clock signals were, for example, switched logic-level signals. By way of contrast, if the clock signals were switched logic-level clock signals, the sensitivity of the output pulse areas to mismatches would be largely lost.

Statistically speaking, over time one would expect the averaged digital outputs of the four ADC banks 48 to be the same as one another. By comparing averaged digital outputs of those ADC banks, different types of error (as briefly mentioned above) may be detected, and as a result calibration may be performed to correct or compensate for those errors. This principle will now be explained in relation to FIGS. 23 and 24.

FIG. 23 is a partial duplication of the waveforms shown in FIG. 12. In the upper graph, partial waveforms for clocks $\theta_3$, $\theta_0$ and $\theta_1$ are shown. Concentration is placed on clock $\theta_0$ and therefore clocks $\theta_3$ and $\theta_1$ are shown in dashed-line form. The lower graph shows three pulse shapes, labeled $P_3$, $P_0$, and $P_1$ which are intended to schematically represent the averaged digital output powers corresponding to the outputs of sampler circuitry 42 generated by clocks $\theta_3$, $\theta_0$ and $\theta_1$, respectively. Waveforms $\theta_3$, $\theta_0$ and $\theta_1$ in FIG. 23 represent the effective gate drives for sampler circuitry 42 which would produce equally-sized averaged digital output powers $P_3$, $P_0$, and $P_1$.

Also shown in FIG. 23 is an effective gate drive $\theta_{0\text{-}P}$ which could for example result from a timing error in the VCO 44. Effective gate drive $\theta_{0\text{-}P}$ is intended to be a phase-shifted version of the effective gate drive $\theta_0$ resulting from such a timing error. In this situation, it could be expected that the power $P_3$ would increase, for example by 10%, that the power $P_0$ would stay the same, and that the power $P_1$ would decrease in line with the increase in $P_3$, again for example by 10%. Detecting this pattern of changes in the averaged digital output powers $P_3$, $P_0$ and $P_1$ could therefore indicate the presence of a timing error in VCO 44 in relation to clock $\theta_0$.

FIG. 24 is a partial duplication of the waveforms shown in FIG. 12, as in FIG. 23. Accordingly, waveforms $\theta_3$, $\theta_0$, $\theta_1$, $P_3$, $P_0$ and $P_1$ in FIG. 24 are identical to those in FIG. 23.

Also shown in FIG. 24 is an effective gate drive $\theta_{0\text{-}M}$, which could for example result from a threshold voltage ($V_{TH}$) error (mismatch) in one of the sampling switches $58_A$ to $58_D$ (or $64_A$ to $64_D$) in sampling circuitry 42. Effective gate drive $\theta_{0\text{-}M}$ is therefore intended to be a magnitude-reduced version of effective gate drive $\theta_0$ resulting from such a $V_{TH}$ error. In this situation, it could be expected that the power $P_0$ would decrease, for example by 20%, and that the neighbouring powers $P_3$ and $P_1$ would increase equally in line with that decrease, for example by 10% each. Detecting this pattern of changes in the average digital output powers $P_3$, $P_0$ and $P_1$ could therefore indicate the presence of such a $V_{TH}$ error.

By way of example, a possible methodology for dealing with the type of error in FIG. 24 will now be considered. For this example, it will be considered that a sampling switch $S_0$ is found to give rise to an output power $P_0$ and a sampling switch $S_1$ is found to give rise to an output power $P_1$. In this example, switches $S_0$ and $S_1$ are corresponding switches of a differential pair.

The following equations may be employed to find a measurement of a threshold voltage error $\Delta V_{TH0}$ in sampling switch $S_0$ and a threshold voltage error $\Delta V_{TH1}$ in sampling switch $S_1$.

offset error=$P_0-P_1 \rightarrow k(V_{TH0}-V_{TH1})$ gain error=$P_0+P_1 \rightarrow k(V_{TH0}+V_{TH1})$ where k is a constant.

$$\Delta V_{TH0} = \frac{\text{gain error} + \text{offset error}}{2}$$

$$\Delta V_{TH1} = \frac{\text{gain error} - \text{offset error}}{2}$$

The calibration may then be performed taking into account the results of this methodology. For example, as will be discussed further below, the bulk and/or gate voltage applied to one or both of sampling switches $S_0$ and $S_1$ could be controlled to reduce or eliminate the mismatches.

From the above explanation regarding FIGS. 23 and 24, it will be appreciated that different types of error (mismatch) may result in different patterns of change in the averaged digital output powers, and therefore that such different types of error may be detected independently of one another or at least compensated for, or calibrated out. Different such types of error may be present simultaneously, however even in this case the various errors may be detected and compensated for by comparing the powers with one another.

Demultiplexers 46 are similar in structure to sampling circuitry 42 as discussed above, and therefore they are similarly susceptible to $V_{TH}$ mismatches. In the same way as a $V_{TH}$ error in a particular sampler switch (e.g. switch $58_A$) can be detected, so an error in a particular demultiplexer switch (e.g. the switch outputting signal $IOUT_{A10}$ in FIG. 17) may be detected by selecting appropriate digital outputs to average and to compare with one another. For example, an averaged digital output power could be obtained for a particular switch under investigation by combining all outputs stemming from that switch, and a corresponding output power could similarly be obtained for another switch in the same tier, and these powers (and other similar powers) could be compared as above, to calibrate the switch under investigation.

Following detection of such errors (mismatches), the calibration circuitry 52 may be used to adjust operation of the ADC circuitry 40 to compensate for those errors. Because the errors are detected by averaging real output signals, the calibration can be carried out "on-line".

In order to effect the calibration, one possible technique is to directly control operation of the VCO 44 as indicated in FIG. 9, for example to adjust the phase offset between the clock signals $\theta_0$ to $\theta_3$ until a phase-error effect as in FIG. 23 is eliminated. Another technique is to directly control operation of the switches, primarily focusing on the sampling switches in sampling circuitry 42 (since they are responsible for taking the samples), and, as a secondary measure, focusing on the switches in demultiplexers 46.

One way to directly control operation of the switches (i.e. of the transistors) is to control the bulk voltage applied to those switches. Another way is to adjust the gate voltages applied to those switches. For example, the clock signals output from the VCO 44 may be AC coupled (e.g. via a series capacitor) to the sampler switches, and thus the DC bias may be adjusted. These two methods may be employed in combination.

FIG. 25 is a schematic diagram of such a switch, in which a trim voltage $V_{TRIM}$ is applied to the body terminal. It has been recognized that mismatch in switching delay may be caused by random variations in the threshold voltages $V_{TH}$ of transistors. The effect of changing the bulk voltage of a particular switch (transistor) is to change the gate-source voltage at which the transistor changes state. By applying appropriate trim voltages $V_{TRIM}$ to the body terminals of switches identified to be causing errors, their bulk voltages may be varied to compensate for the effects of random threshold voltage variations on their switching points. This technique may also be used to compensate for other mismatches, i.e. by varying operation of the transistors until the effects of those other mismatches are eliminated. A technique of bulk-voltage variation is disclosed in EP07113379.7 (the entire contents of which, in particular in relation to FIG. 13 thereof, are incorporated herein by reference) and this technique may be applied by analogy in embodiments of the present invention.

Calibration can accordingly be carried out "on-line" until the chosen averaged digital output powers are equal to one another. In this state, the pulses on average have the same area, in which case they have the same width and are thus equally spaced apart. In this way, sampling skew is removed to a first order approximation.

FIGS. 26 and 27 present simulation results for a full implementation of ADC circuitry 40 configured for the sampling circuitry 42 to perform 1:4 demultiplexing and for the demultiplexers 46 to be single-stage 1:4 demultiplexers, so that the overall circuitry performs 1:16 demultiplexing.

In the simulation, the output current pulses are integrated onto ADC input capacitors, and the outputs of the demultiplexers 46 are recombined to create an equivalent single ADC output signal. That single output signal is then subject to FFT processing to produce the frequency-domain results in FIG. 26. In the upper chart in FIG. 26, the uppermost trace represents a fast silicon process, the middle trace represents a typical silicon process, and the lower trace represents a slow silicon process. Those three processes are also represented in the other two charts. The results in FIG. 27 are actual time-domain signal traces from the simulation.

It can be appreciated that the main cause of bandwidth roll-off is the sample pulse shape as mentioned above. There is small variation over PVT (Process, Voltage, Temperature) tolerance, for example +/−1 dB at 20 GHz as shown in the top chart in FIG. 26. This roll-off can be corrected using a simple fixed three-tap FIR (Finite Impulse Response) filter producing close to linear phase including the FIR equalizer, as mentioned previously.

It can be further seen that the output has an ENOB (effective number of bits) of greater than 8 bits for an input signal frequency of up to 20 GHz. This was measured with a full-scale sinewave. Sampler distortion will fall with signal level.

FIG. 28 is a schematic diagram of parts of ADC circuitry 40 according to one embodiment of the present invention, incorporating a refinement. For simplicity, the circuitry in FIG. 28 is presented schematically in a similar format to that in FIG. 17, except that the resistances are omitted and the switches are represented as crosses. Also for simplicity, only parts of the sampler circuitry 42 and demultiplexer circuitry 46 are shown, as in FIG. 17. However, both the "plus" and "minus" complementary sections 54 and 56 are shown.

A tail node in the demultiplexer circuitry 46 of section 54 is marked with numeral 200 and the corresponding tail node in section 56 is marked with numeral 202. As mentioned earlier, such nodes (like root tail nodes 60 and 66 in the sampler circuitry 42) generally have a parasitic capacitance, and therefore a tiny (but nonetheless existent) amount of charge can be stored over those parasitic capacitances as packets or pulses of charge pass through those nodes during use.

As the circuitry in FIG. 28 is differential circuitry, it is not specifically the size of the individual packets of charge that is important, but more so the difference between the size of a packet of charge passing through section 54 and its corresponding complementary packet of charge passing through section 56. An amount of charge may be left behind over the parasitic capacitance of, for example, node 200 as a packet/pulse of charge passes through, and a different amount of charge may be similarly left behind at node 202. Thus, these amounts of residual charge may affect the sizes of the next pair of pulses that pass through, and thus be the cause of errors.

To aim to solve this problem, the circuitry of FIG. 28 comprises reset circuitry 210. Reset circuitry 210 takes advantage of the so-called "down time" that node pair 200 and 202 have between packets of charge. During this down time, the equalization circuitry acts to bring each of nodes 200 and 202 to the same potential that it was at prior to the previous packet it carried. In this way, each of those nodes is returned to the same starting voltage each time before a packet passes through, so that the effect of any residual charge is the same for each packet. This is one way of aiming to keep the difference in potential between the two nodes of the pair the same from cycle to cycle.

In the present embodiment, reset circuitry 210 may, for example, be implemented as a pair of switches (not shown), connecting their respective nodes 200 and 202 to ground via a large capacitance. Those switches may make use of an existing clock signal that is active for another node at a time when nodes 200 and 202 are intended to be inactive. In that way, nodes 200 and 202 may both be connected to ground together to return the residual charge on each of them to a starting value during the down time. By returning the residual charge on the two complimentary nodes 200 and 202 to a starting value (which may be different for each node), an error that might otherwise have impacted on the next set of pulses may be substantially prevented.

Reset circuitry 210 may be implemented in many other ways, for example it may even be employed to connect nodes 200 and 202 together each time, to equalize the charge on those nodes.

Of course, reset circuitry 210 may be provided for any or all pairs of complementary nodes in the tree structures of Sections 54 and 56, to reset the residual charge on them during their "down time". This includes all nodes in the tree structure right through the demultiplexer circuitry 46A through to the sub-ADC circuitry 46B & 48 (see FIG. 21), in each case using an appropriate existing (or possibly dedicated) clock signal to activate the switches concerned during the down time for the pair of nodes concerned. This technique is unpractical between nodes 60 and 66, since they do not have "down time" in the way that the other nodes do (which can be appreciated from a comparison of FIG. 13 with FIG. 18).

The present invention may be embodied in many other different forms, within the scope of the appended claims.

The present invention is considered to extend to the present statements:

What is claimed is:

1. An analogue-to-digital conversion circuit, comprising:
a first node configured to receive an input current signal;
a plurality of first switch circuits including a plurality of first terminals and a plurality of second terminals, each of the plurality of first terminals being coupled to the first node, the plurality of first switch circuits being configured to sample the input current signal in accordance with a plurality of sinusoidal control signals and generate a plurality of sample current signals; and
a plurality of analogue-to-digital converters coupled to the plurality of second terminals and configured to convert the plurality of sample current signals and generate a plurality of converted signals.

2. The analogue-to-digital conversion circuit of claim 1, wherein the plurality of first switch circuits are configured to be sequentially selected during corresponding ones of a plurality of selection periods which occur in succession, successive selection periods of the plurality of selection periods being partially overlapped.

3. The analogue-to-digital conversion circuit of claim 2, wherein the selection periods of the plurality of selection periods which occur in non-succession are non-overlapped.

4. The analogue-to-digital conversion circuit of claim 2, further comprising:
a reset circuit configured to bring a voltage potential of at least one of the plurality of second terminals to a particular value at a time between successive selection periods for the at least one first switch circuit.

5. The analogue-to-digital conversion circuit of claim 1, further comprising:
a digital circuit configured to generate a digital output signal on the basis of the plurality of converted signals.

6. The analogue-to-digital conversion circuit of claim 1, further comprising:
a plurality of demultiplexers coupled between the plurality of second terminals and the plurality of analogue-to-digital converters, each of the plurality of demultiplexers being configured to demultiplex a corresponding one of the plurality of sample current signals and generate a plurality of demultiplexed current signals,
wherein each of the plurality of analogue-to-digital converters is configured to convert the plurality of demultiplexed current signals and generate a corresponding one of the plurality of converted signals.

7. The analogue-to-digital conversion circuit of claim 6, wherein each of the plurality of demultiplexers includes a plurality of second switch circuits configured to generate the plurality of demultiplexed current signals on the basis of the corresponding one of the plurality of sample current signals.

8. The analogue-to-digital conversion circuit of claim 1, further comprising:
a calibration circuit configured to calibrate characteristics of the plurality of first switch circuits on the basis of the plurality of converted signals.

* * * * *